United States Patent [19]
Kono et al.

[11] Patent Number: 6,121,806
[45] Date of Patent: Sep. 19, 2000

[54] CIRCUIT FOR ADJUSTING A VOLTAGE LEVEL IN A SEMICONDUCTOR DEVICE

[75] Inventors: Takashi Kono; Takayuki Miyamoto; Katsuyoshi Mitsui; Shinichi Jinbo, all of Tokyo, Japan

[73] Assignee: Mitsubishi Denki Kabushiki Kaisha, Tokyo, Japan

[21] Appl. No.: 09/166,909

[22] Filed: Oct. 6, 1998

[51] Int. Cl.[7] .................................. H03K 3/286
[52] U.S. Cl. .......................... 327/205; 327/206; 327/68; 327/74
[58] Field of Search .................... 327/205, 206, 327/65, 68, 74, 77, 81, 89, 530, 538, 540, 534, 535, 536, 537

[56] References Cited

U.S. PATENT DOCUMENTS

| | | | |
|---|---|---|---|
| 5,130,635 | 7/1992 | Kase | 327/535 |
| 5,602,503 | 2/1997 | Muto | 327/538 |
| 5,694,072 | 12/1997 | Hsiao et al. | 327/537 |
| 5,736,894 | 4/1998 | Suwa | 327/538 |

FOREIGN PATENT DOCUMENTS

| | | |
|---|---|---|
| 58-139221 | 8/1983 | Japan . |
| 9-82095 | 3/1997 | Japan . |

*Primary Examiner*—Timothy P. Callahan
*Assistant Examiner*—An T. Luu
*Attorney, Agent, or Firm*—McDermott, Will & Emery

[57] ABSTRACT

A level adjusting circuit for controlling a voltage supplied to a load such as a semiconductor device, which comprises a voltage level detecting circuit, a reference potential generating circuit for generating a pair of reference potential values to be output into the voltage level detecting circuit, and a monitor pad for drawing out the voltage supplied to the load, wherein the reference potential values are respectively used to compare with the voltage to thereby output a signal for starting supply of the voltage and a signal for ceasing the supply of the voltage under a usually used condition; and the voltage level detecting circuit is to compare either one of the reference potential values with the voltage or the other reference potential value with the voltage at a time under a testing condition, whereby the reference potential generating circuit can accurately be adjusted to change the reference potential values to render the voltage in a range permissible for operation of the load.

18 Claims, 21 Drawing Sheets

OSCILLATOR FOR PUMP CLOCK

PUMP SIGNAL GENERATOR

PUMP BODY

F I G . 7 d
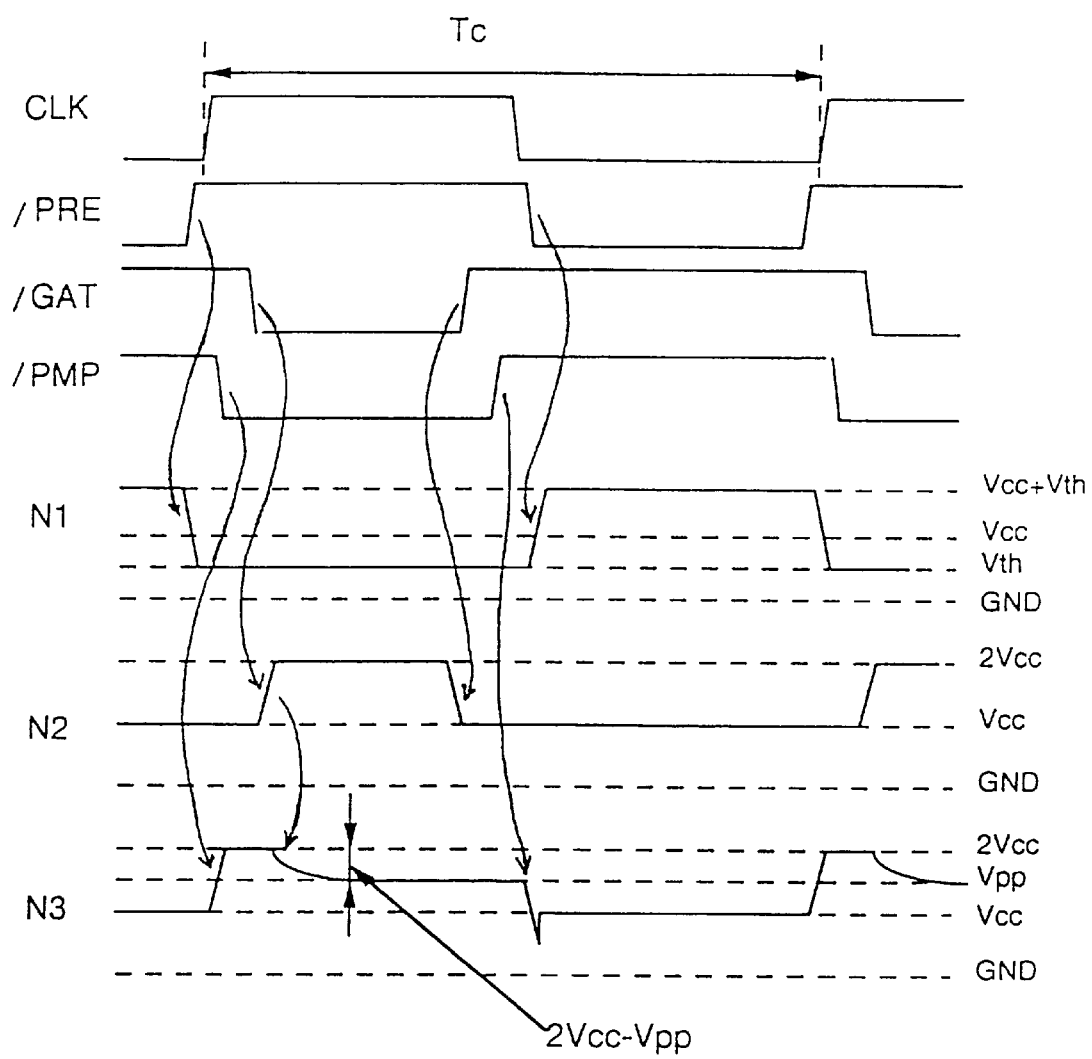

F I G. 9
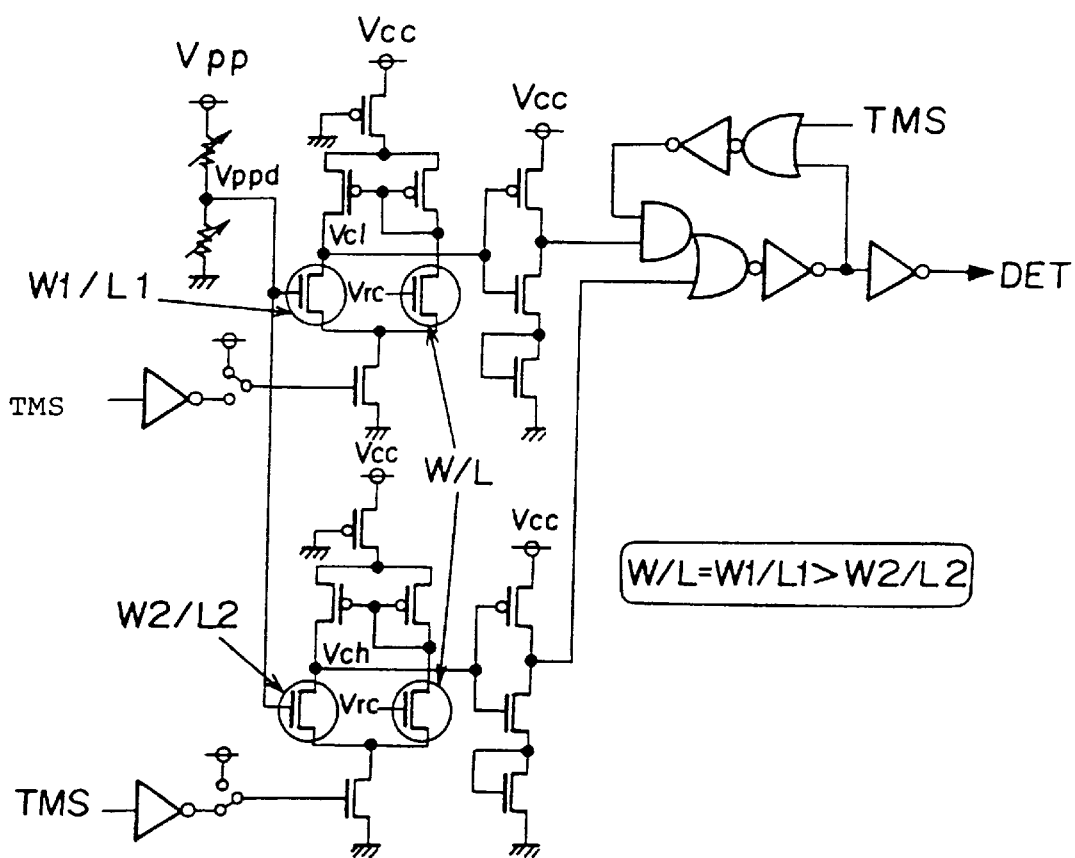

F I G. 17
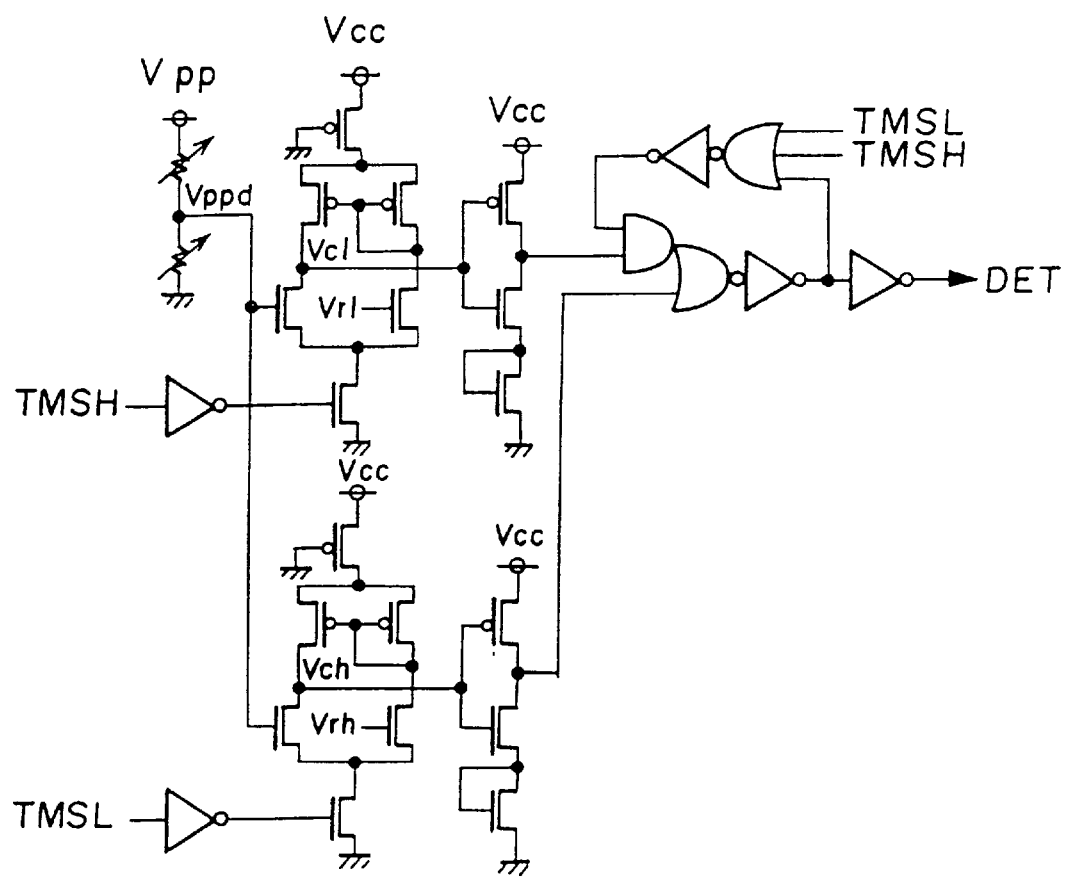

F I G. 18
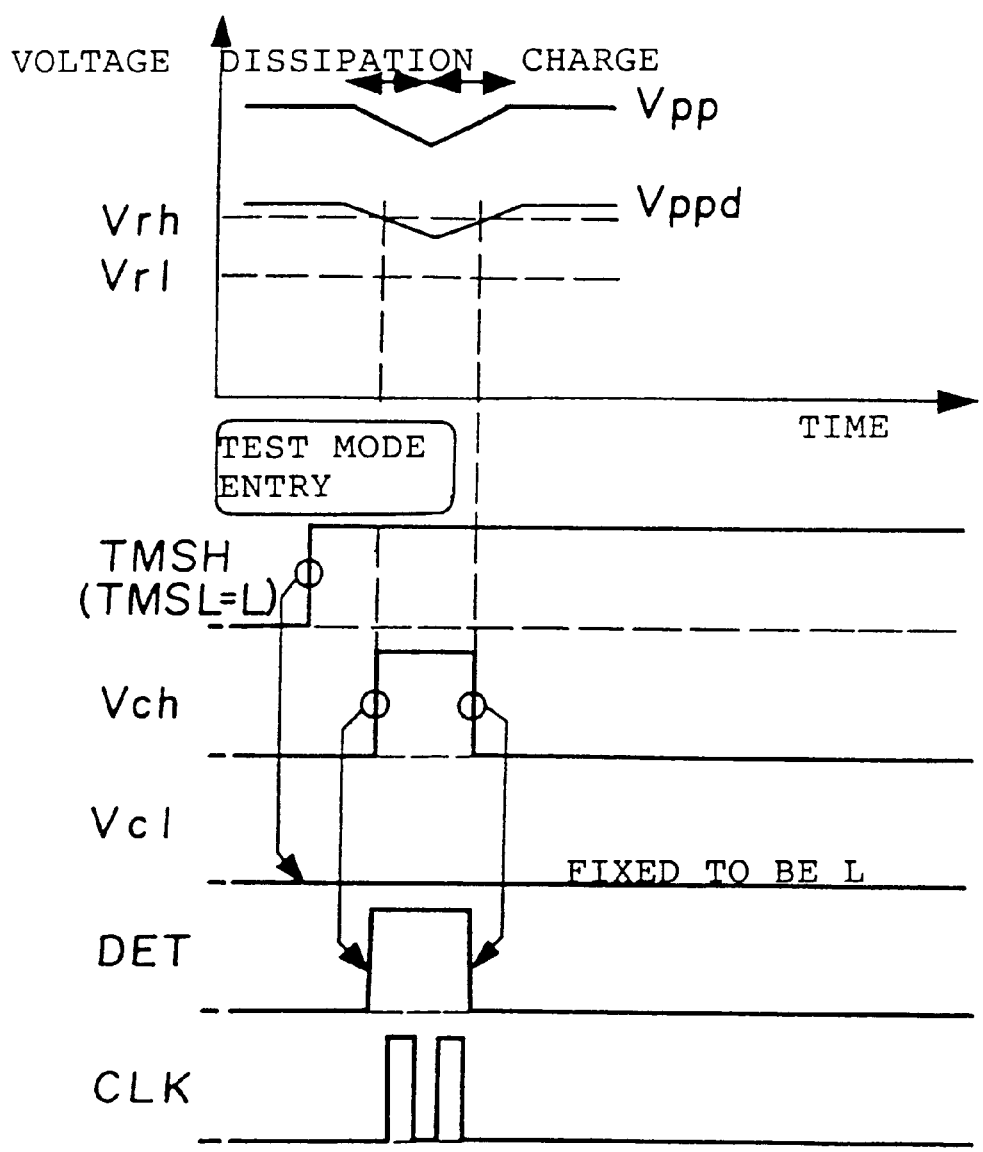

CIRCUIT FOR ADJUSTING A VOLTAGE LEVEL IN A SEMICONDUCTOR DEVICE

BACKGROUND OF THE INVENTION

1. Field of the Invention

The present invention relates to a circuit for detecting a voltage level in a semiconductor device having a characteristic of hysteresis Particularly, the present invention relates to a circuit for arbitrarily selecting and detecting one of the maximum level and the minimum level of the gate voltage in a semiconductor device for further accurately tuning a characteristic of hysteresis formed by the maximum level and the minimum level More particularly, the present invention relates to a circuit for detecting a voltage level in a semiconductor device which can output a signal which can be externally monitored for further accurately tuning the device.

2. Discussion of Background

It is advantageous to reduce the area size of a semiconductor chip in various aspects. For example, when the chip is equipped in a portable remote terminal, it is possible to prevent the size of the portable remote terminal as a whole from increasing by reducing an area occupied by the chip in a board. Further, by the reduction of the area, the number of chips obtainable from one wafer increases, whereby the cost becomes more competitive. Further, it is expected that power dissipation in the chip is lowered in consideration of internal operation of the chip because a data bus length and so on can be restricted.

In order to practically reduce the area size of a chip, it is sufficient to further reduce dimensions for etching so as to make a size of transistor small. On such occasion, the film thickness of the gate oxide film (hereinbelow referred to as Tox) of the transistor is also made thin in accordance with the scaling law. As a result, although the efficiency of transistor is improved, there will be caused a problem about reliability by the thinned gate oxide film. In other words, the gate oxide film is apt to be destroyed by a lower gate voltage and therefore it is not possible to readily apply a high gate voltage.

For example, transistors composing memory cells of a dynamic random access memory (DRAM), which is one of representative semiconductor memories, will be considered. Generally, a boosted voltage (hereinbelow referred to as Vpp) is applied to a gate voltage in order to write satisfactory data of high (H) into the memory cell. Provided that a level of the data of high (H) is Vh and a threshold value of the cell transistor is Vthh, the relation between these can be expressed as Vpp>Vh+Vthh. Accordingly, the level of Vpp can be fairly high. In order to avoid such situation, it is necessary to reduce the level of Vpp and simultaneously control variations of Vpp with accuracy by adopting a method of reducing Vthh in the manufacturing process, a method of reducing Vh by increasing a margin for operating the cell, and so on.

For example, in a DRAM, it is necessary to reflesh cells because data of H written in the cells are lost in accordance with a lapse of time. Frequency of refleshing is determined by a capability of holding data in the cells. Such capability can be enhanced by improvements of physical values and of circuit competence in the manufacturing process. Also, it is possible to normally read out the data by increasing sensitivity of a sense amplifier even through a part of data in the cells is lost to a certain extent.

Factors of the variations of Vpp are dissipation causes by charging and discharging loads on Vpp, for example, gates of the memory cell and word lines (hereinbelow referred to as WL) connected thereto, charging the load on Vpp and a decoupling capacitance on Vpp with an electric current supplied from a Vpp pump for supplementing the dissipation, whereby the level of Vpp varies by several hundred mm volts (mV) around a certain level.

In this, the decoupling capacitance is necessary for storing electric potential generated in the circuit, which potential is not limited to Vpp, because generated electric charges should be absorbed somewhere to suppress a variation of the internal electric potential accompanied by internal operation. The decoupling capacitance is, for example, a parasitic capacitance existing in wiring for supplying internal potential to various portions and a gate capacitance of a transistor receiving such internal potential. Although the sum of these capacitances may be sufficient as the decoupling capacitance, an additional decoupling capacitance is provided in an appropriate location by utilizing an inter-layer film interposed between proper flat plates arranged in parallel, a gate capacitance of transistor, or other various means when such a parasitic capacitance is not sufficient. The level of Vpp can be controlled based on a circuit for detecting the Vpp level, and a range of variability of the Vpp level is determined by a velocity of reaction of the circuit for detecting the Vpp level and a capability of the Vpp pump. A case that the velocity of reaction of the circuit for detecting Vpp level is sufficiently higher than a velocity of dissipation of Vpp, and the capability of the Vpp pump is sufficiently high will be considered. The level of charging the load on Vpp and the decoupling capacitance on Vpp is controlled to be higher than a target level of Vpp, which is an average level of Vpp, because it is practically intended to supply for the dissipation of Vpp occurred during a catch-up reaction time of the circuit for detecting the Vpp level to the first operation of rows. Thus, it was preferable to constitute the circuit for detecting the Vpp level so that the level of stopping the charge and the level of detecting the insufficient charge are different, whereby the circuit resultantly has a characteristic of hysteresis.

On the other hand, two reaction levels by the characteristic of hysteresis in the circuit for detecting the Vpp level is based on a certain reference potential. This reference potential is supplied from a circuit for generating reference potential, and these levels are tuned and adjusted to be an appropriate value before the delivery. In general, a method for tuning is to use a pad by which the Vpp level can be monitored and to measure outputs from the pad by a tester and so on obtained before and after fuses of the circuit for generating reference voltage are cut.

In accordance with the above-mentioned method, the detecting level by the circuit for detecting Vpp level was tuned based on an average value of the variations of the Vpp level. Therefore, even though the range of variability was wide, as long as the average value between the maximum level and the minimum level was the same, it was turned to be an identical level. When the minimum level was too low, sufficient data of H could not be written in memory cells, whereby malfunction was caused. Further, since the Vpp level was monitored by means of the pad, the Vpp level was not accurately monitored if the pad was shorted to the other potential values in the vicinity of the monitor pad.

Although the problems were explained with respect to the circuit utilizing Vpp as described in the above, it is generally common to a circuit for detecting a level which circuit has a characteristic of hysteresis.

SUMMARY OF THE INVENTION

It is an object of the present invention to accurately tune a characteristic of hysteresis in a level detecting circuit for detecting an internal potential level provided in a semiconductor device by invalidating the characteristic of hysteresis when a mode (hereinbelow referred to as a testing condition) different from a usually used mode (i.e. usually used condition) and by enabling one of such levels to be selected and the one level to be detected.

Another object of the present invention is to further accurately tune the level detecting circuit by enabling an output from the level detecting circuit to be directly monitored from the outside under the testing condition.

According to a first aspect of the present invention, there is provided a voltage level detecting circuit for generating hysteresis upon receipt of a plurality of reference potential values generated by a peripheral circuit connected thereto under a usually operating condition and for selecting one of said plurality of reference potential values and comparing said voltage with said one of the reference potential values to adjust a voltage in said circuit under a testing condition.

According to a second aspect of the present invention, there is provided a voltage level detecting circuit according to the first aspect of the invention, which comprises:

a plurality of comparators respectively correspond to and receive said plurality of reference potential values for comparing these with said voltage to thereby output a detection signal for respectively determining timing for starting and ceasing to supply said voltage to said circuit under the usually operating condition, wherein under the testing condition, one of said plurality of comparators is activated to compare said voltage with said one of the reference potential values corresponding to said one of the comparators.

According to a third aspect of the present invention, there is provided a voltage level detecting circuit according to the second aspect of the invention, further comprising:

a plurality of terminals for receiving a test mode signal for entering the testing condition, and a plurality of switches respectively connected between said terminals and said comparators to connect and disconnect transmission of said test mode signal to said comparators, wherein the testing condition is selected upon receipt of said test mode signal, and under thus selected testing condition, said one of the comparators to be activated is selected by turning on or turning off one of said switches corresponding to said one of the comparators.

According to a fourth aspect of the present invention, there is provided a voltage level adjusting circuit activated base on a plurality of reference potential values forming hysteresis under a usually operating condition and using one of said plurality of reference potential values to determine a voltage in a load connected thereto under a testing condition, which comprises:

a voltage level detecting circuit, a reference potential generating circuit for outputting signals of said plurality of reference potential values to said voltage level detecting circuit, and a voltage pump circuit receiving a detection signal output from said voltage level detecting circuit, an output of which voltage pump circuit is further coupled to said load and said voltage level detecting circuit through a line, wherein under the testing condition, one of said signals of the plurality of reference potential values is selected in said voltage level detecting circuit for adjusting said one of the reference potential values by setting said reference potential generating circuit so that said load is supplied with said voltage within a range permissible for operation of the load from said voltage pump circuit.

According to a fifth aspect of the present invention, there is provided a voltage level adjusting circuit according to an fourth aspect of the invention, further comprising:

a test mode entry circuit for outputting a test mode signal to said voltage level detecting circuit for entering it in the testing condition, and a monitor pad connected to said line for accessing said voltage in said load.

According to a sixth aspect of the present invention, there is provided a voltage level adjusting circuit according to the fifth aspect of the invention, wherein said voltage level detecting circuit includes a plurality of comparators respectively correspond to and receive said plurality of reference potential values for comparing these with said voltage to output said detection signals for respectively determining timing for starting and ceasing to supply said voltage to said voltage pump circuit under the usually operating condition; and under the testing condition, one of said plurality of comparators is activated to compare said voltage with said one of the reference potential values corresponding to said one of the comparators.

According to a seventh aspect of the present invention, there is provided a voltage level adjusting circuit according to the fourth aspect of the invention, wherein said voltage level detecting circuit includes a plurality of comparators respectively correspond to and receive said plurality of reference potential values for comparing these with said voltage to output said detection signals for respectively determining timing for starting and ceasing to supply said voltage to said voltage pump circuit under the usually operating condition; and under the testing condition, one of said plurality of comparators is activated to compare said voltage with said one of the reference potential values corresponding to said one of the comparators.

According to an eighth aspect of the present invention, there is provided a voltage level adjusting circuit according to the sixth aspect of the invention, wherein said reference potential generating circuit outputs a single signal of reference potential value instead of said signals of the plurality of reference potential values;

and in said comparators in said voltage level detecting circuit, transistors having different gate widths, different gate lengths, or both of the different gate widths and the different gate lengths are provided to generate a plurality of reference potential values based on said single signal received from said reference potential generating circuit.

According to a ninth aspect of the present invention, there is provided a voltage level adjusting circuit according to the seventh aspect of the invention, wherein said reference potential generating circuit outputs a single signal of reference potential value instead of said signals of the plurality of reference potential values;

and in said comparators in said voltage level detecting circuit, transistors having different gate widths, different gate lengths, or both of the different gate widths and the different gate lengths are provided to generate a plurality of reference potential values based on said single signal received from said reference potential generating circuit.

According to a tenth aspect of the present invention, there is provided a voltage level adjusting circuit according to the sixth aspect of the invention, wherein
  said test mode entry circuit outputs a plurality of test mode signals instead of receiving said single test mode signal respectively for stating a test based on said one of said signals of the plurality of reference potential values; and
  in said voltage level detecting circuit, said plurality of comparators receive said plurality of test mode signals and output said detection signal based on states of said plurality of test mode signals.

According to a eleventh aspect of the present invention, there is provided a circuit for adjusting a level of a voltage used to activate a semiconductor device according to the fifth aspect of the invention, further comprising:
  a monitor pad controlling circuit which receives said detection signal from said voltage level detecting circuit and buffers the detection signal, and
  a second monitor pad for drawing out the output of the buffered detection signal from said monitor pad controlling circuit for directly observing the detection signal.

According to a twelfth aspect of the present invention, there is provided a circuit for adjusting a level of a voltage used to activate a semiconductor device according to the sixth aspect of the invention, further comprising:
  a monitor pad controlling circuit which receives said detection signal from said voltage level detecting circuit and buffers the detection signal, and
  a second monitor pad for drawing out the output of the buffered detection signal from said monitor pad controlling circuit for directly observing the detection signal.

According to a thirteenth aspect of the present invention, there is provided a circuit for adjusting a level of a voltage used to activate a semiconductor device according to the tenth aspect of the invention, further comprising:
  a monitor pad controlling circuit which receives said detection signal from said voltage level detecting circuit and buffers the detection signal, and
  a second monitor pad for drawing out the output of the buffered detection signal from said monitor pad controlling circuit for directly observing the detection signal.

According to a fourteenth aspect of the present invention, there is provided a circuit for adjusting a level of a voltage used in an electrical load comprising:
  a voltage level detecting circuit,
  a reference potential generating circuit for outputting signals of a pair of reference potential values to said voltage level detecting circuit,
  a voltage pump circuit receiving a detection signal output from said voltage level detecting circuit, an output of which voltage pump circuit is further coupled to said voltage level detecting circuit through a line,
  a load connected to said line, which load is to dissipate said voltage,
  a test mode entry circuit for outputting a test mode signal to said voltage level detecting circuit, and
  a monitor pad connected to said line for accessing said voltage in said line, wherein
    said reference potential generating circuit includes fuses for adjusting said signals of the pair of reference potential values;
    said voltage level detecting circuit includes:
      an input terminal for receiving said voltage in said line,
      a voltage dividing circuit for outputting a voltage signal to be compared with said signals of the pair of reference potential values,
      terminals for receiving said test mode signal,
      comparators respectively provided to receive said signals of the pair of reference potential values, said voltage signals, and said test mode signal, for comparing said voltage signal with one of said signals of the pair of reference potential values according to a state of said test mode signal in order to output said detection signal for respectively stating timing for starting the supply and timing for ceasing the supply,
      switches respectively provided for said comparators to connect and to disconnect transmission of said test mode signal to said comparators,
      a circuit for outputting said detection signal based on the state of said test mode signal, and
    said test mode entry circuit outputs said test mode signal upon receipt of combinations of external control signals and address signals; wherein
    one of said signals of the pair of reference potential values is selected for adjusting the same at a time in the voltage level detecting circuit by trimming the fuses in said reference potential generating circuit while monitoring said voltage of said line from said monitor pad so that said load is supplied with said voltage within a range permissible for operation of the load from said voltage pump circuit.

According to a fifteenth aspect of the present invention, there is provided a circuit for adjusting a level of a voltage used in an electrical load according to the fourteenth aspect of the invention, wherein said reference potential generating circuit outputs a single signal of reference potential value instead of said signals of the pair of reference potential values; and
  in said comparators in said voltage level detecting circuit, transistors having different gate widths, different gate lengths, or both of the different gate widths and the different gate lengths are provided to generate a pair of reference potential values based on said single signal received from said reference potential generating circuit.

According to a sixteenth aspect of the present invention, there is provided a circuit for adjusting a level of a voltage used in an electrical load according to the fourteenth aspect of the invention, wherein
  said reference potential generating circuit includes:
    a constant-current circuit for generating a constant current and a channel resistor receiving the constant current, which channel resistor includes transistors connected in serial so that the drain of one of the transistors is connected to the source of the other transistor adjacent thereto; the gates of the transistors are commonly connected; and said signals of the pair of reference potential values are respectively output from different connections between one of the drains and the source adjacent thereto; and fuses are respectively provided between the sources and the drains of the transistors so that said signals of the pair of reference potential values can be independently determined by partially trimming said fuses;
  said test mode entry circuit outputs a pair of test mode signals respectively for stating a test based on said one of said signals of the pair of reference potential values and a test based on the other signal of the pair of reference potential values; and in said voltage level detecting circuit, the comparators receive said pair of test mode signals instead of receiving said test mode signal; the switches are respectively provided to connect and disconnect transmission of the said pair of test mode signals to the respective comparators; and the circuit for outputting said detection signal outputs based on states of said pair of test mode signals.

According to a seventeenth aspect of the present invention, there is provided a circuit for adjusting a level of a voltage used in an electric load according to the sixteenth aspect of the invention, further comprising:

a monitor pad controlling circuit which receives said detection signal from said voltage level detecting circuit and buffers the detection signal, and a second monitor pad for drawing out the output of the buffered detection signal from said monitor pad controlling circuit for directly observing the detection signal.

According to a eighteenth aspect of the present invention, there is provided a circuit for adjusting a level of a voltage used in an electrical load according to the fourteenth aspect of the invention, further comprising:

a monitor pad controlling circuit which receives said detection signal from said voltage level detecting circuit and buffers the detection signal, and a second monitor pad for drawing out the output of the buffered detection signal from said monitor pad controlling circuit for directly observing the detection signal.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7d shows operation of the Vpp pump circuit according to Embodiment 1 of the present invention;

FIG. 9 is a circuit diagram of a circuit for detecting Vpp level in a state based on a reference potential Vrc according to Embodiment 2 of the present invention;

FIG. 17 in a circuit diagram of the circuit for detecting Vpp level in a state based on a reference potential Vrh according to Embodiment 3 of the present invention;

FIG. 18 shows operation of the circuits in a test mode under a state based on the reference potential Vrh along with timing of signals from the circuits according to Embodiment 3 of the present invention;

DETAILED DESCRIPTION OF THE PREFERRED EMBODIMENTS

A detailed explanation will be given of preferred Embodiments of the present invention in reference to the attached Figures, wherein the same numerical references are used for the same or the similar portions and description of these portions is omitted.

Although, a system for detecting a level of a potential boosted to a voltage of a gate electrode (Vpp) in a dynamic random access memory (DRAM) will be exemplified in order to comprehensively explain the present invention, it is needless to say that the present invention can also be applied to a general system for detecting a level which system having a characteristic of hysteresis.

EMBODIMENT 1

Figure 1:
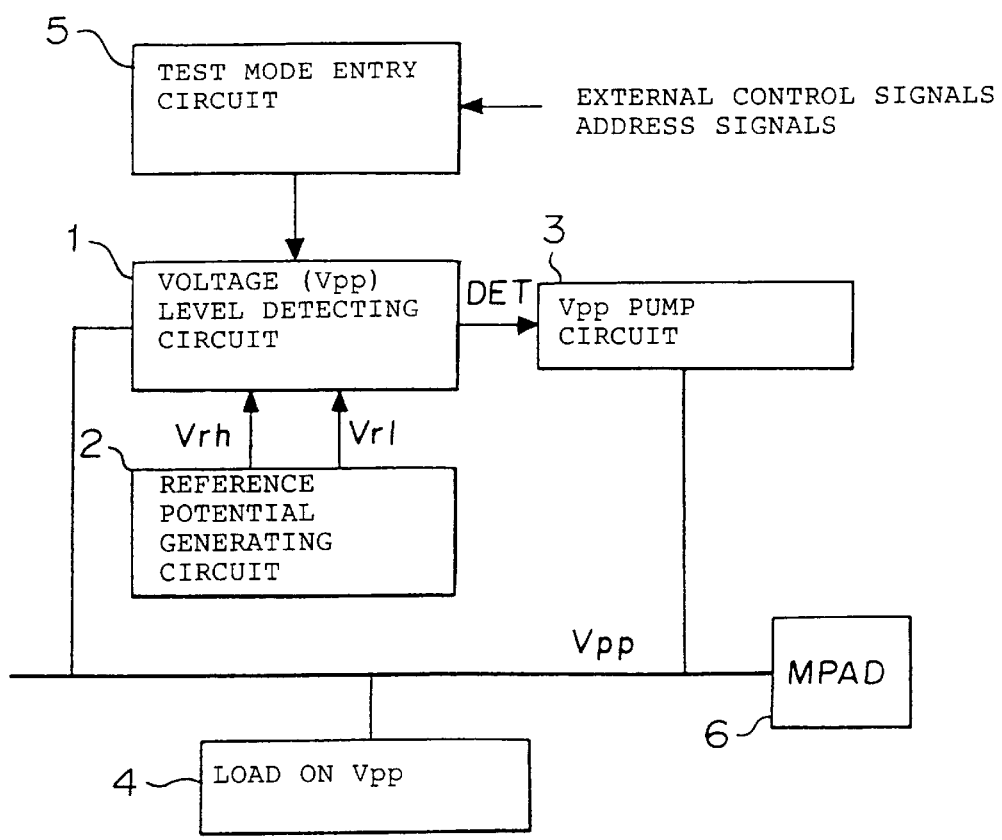
FIG. 1 is a block diagram for showing a relation between circuits and signals according to Embodiment 1 of the present invention.
Figure 2:
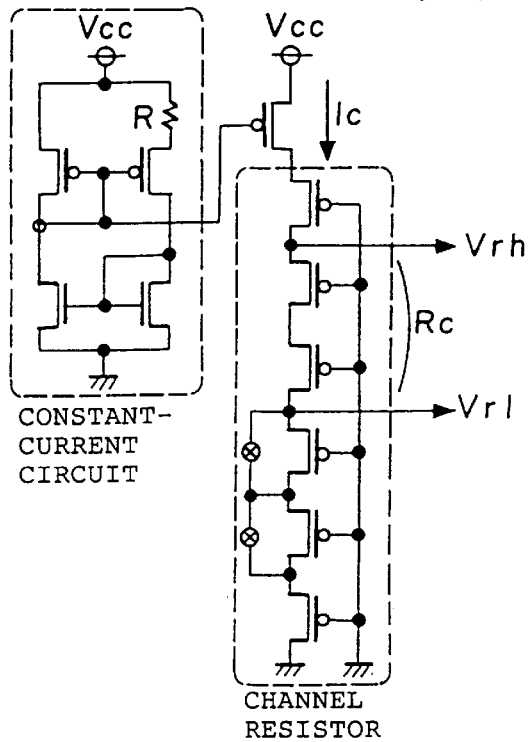
FIG. 2 is a circuit diagram of a circuit for generating reference potential values according to Embodiment 1 of the present invention.

FIG. 1 shows a circuit structure in accordance with Embodiment 1 as a whole. Reference numeral 1 designates a Vpp level detecting circuit; reference numeral 2 designates a reference potential generating circuit with a tuning mechanism; reference numeral 3 designates a Vpp pump circuit; reference numeral 4 designates a load on Vpp; reference numeral 5 designates a test mode entry circuit; and a reference numeral 6 designates a monitor pad (hereinbelow referred to as MPAD); a reference TMS designates a selection signal between a test mode and a usually used mode; a reference DET designates a detection signal; a reference Vrh designates a higher reference potential; a reference Vrl designates a lower reference potential; a reference Vpp designates a potential boosted up to a voltage of a gate electrode. The structure includes, as constitutional elements, the Vpp level detecting circuit 1, the reference potential generating circuit 2, the Vpp pump circuit 3, the load on Vpp 4, the test mode entry circuit 5, and the monitor pad 6. The load on Vpp is a system of dissipating Vpp by its internal operation based on an outer signal. In Embodiment 1, although an example of the circuit diagram of the load on Vpp is not specifically described, a portion of the memory cell array in a DRAM is, for example, one of such load on Vpp. FIG. 2 shows an example of the reference potential generating circuit. In Embodiment 1, a characteristic of hysteresis is determined by two reference potential values. These reference potential values are generated by passing a constant current generated by a constant-current circuit shown in FIG. 2 through a resistance fabricated by a series connection of P-type metal-oxide semiconductor (pMOS) It is possible to vary a resistance value of channel for determining a level of the lower reference potential Vrl within a predetermined range by tuning. In addition, the higher referential potential Vrh is always higher than the reference potential Vrl by a predetermined value. Therefore, provided that a constant current supplied from the constant-current circuit is represented by Ic and a resistance of channels existing between the two reference potential values is represented by Rc, the reference potential Vrh is higher than the reference potential Vrl by a value-represented by $$Vrh-Vrl=Rc \times Ic.$$

Figure 3:
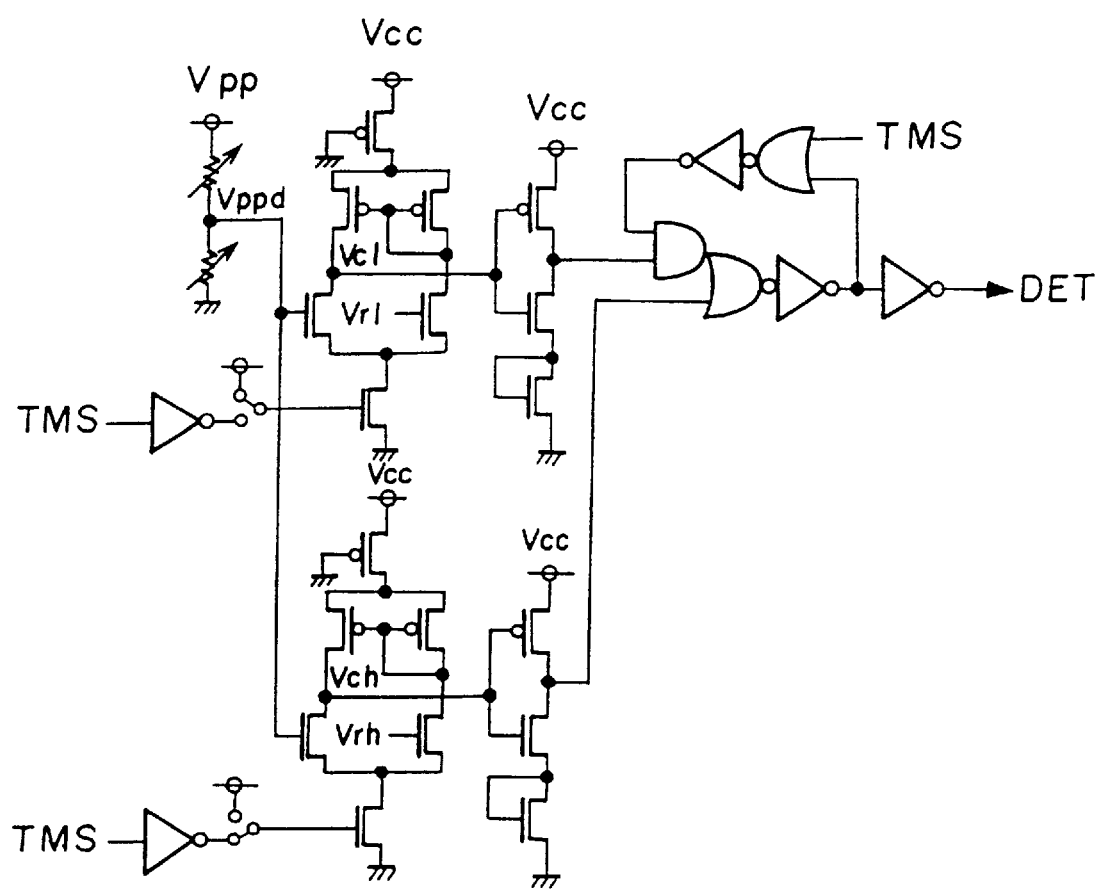
FIG. 3 is a circuit diagram of a circuit for detecting Vpp level in a state based on a reference potential Vr1 according to Embodiment 1 of the present invention.
Figure 5:
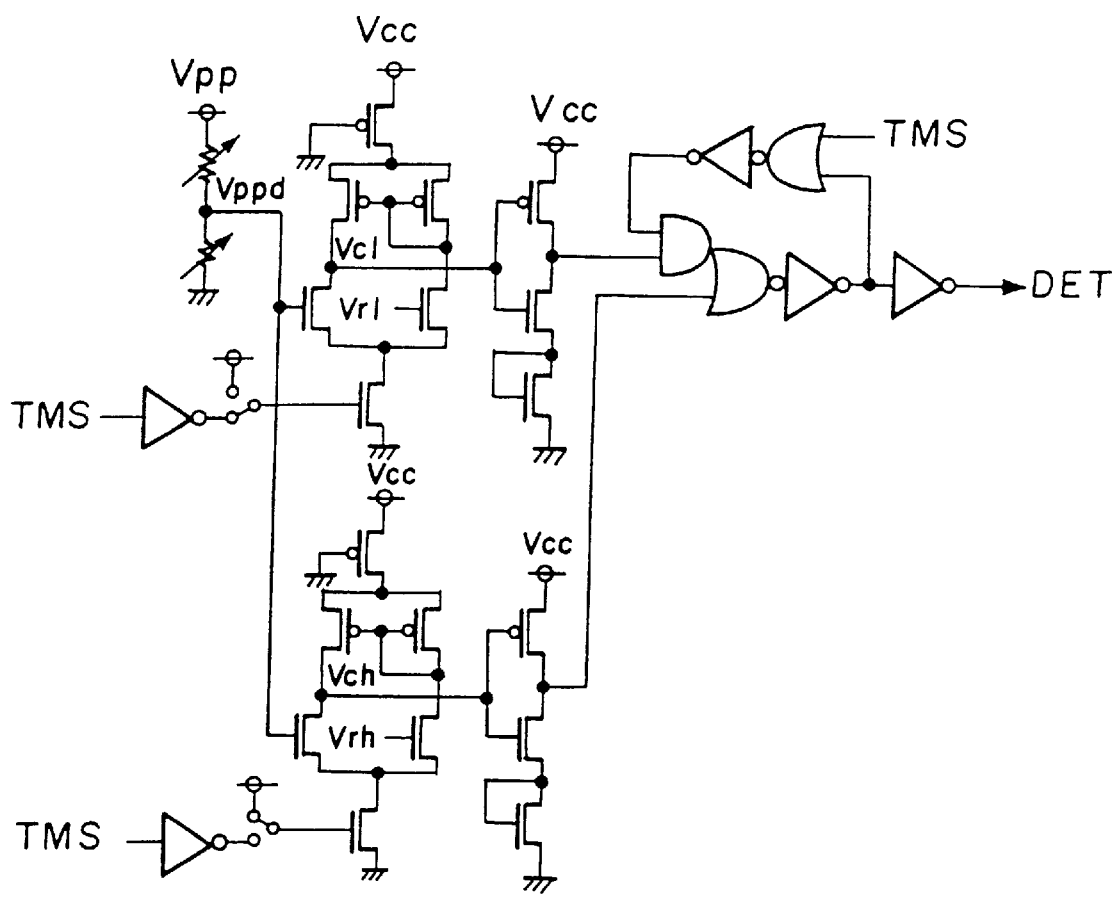
FIG. 5 is a circuit diagram of the circuit for detecting Vpp level in a state based on a reference potential Vrh according to Embodiment 1 of the present invention.

FIGS. 3 and 5 show an example of the Vpp level detecting circuit, wherein FIG. 3 and FIG. 5 respectively show a state based on the reference potential Vrl and the reference potential Vrh.

In FIG. 3, the reference potential Vrl supplied from the reference potential generating circuit shown in FIG. 2 and a level of Vppd obtained by dividing the Vpp level by means of resistances or variable resistances are compared each other, wherein if the Vpp level is judged to be insufficient as a result of detection, the DET signal of high (H) is output. Upon a receipt of the DET signal H, the Vpp pump circuit is activated and thereby the load on Vpp is charged.

In FIG. 5, the reference potential Vrh supplied from the reference potential generating circuit shown in FIG. 2 and the level Vppd obtained by dividing the Vpp level by means of resistances or variable resistances are compared each other, wherein if the Vpp level is judged to be insufficient as a result of the detection, the DET signal H is output. Upon receipt of the signal H, the Vpp pump circuit is activated and the load on Vpp is charged.

In this, a relation between the Vpp level and the reference potential Vrl is represented by Vpp=N×Vrl, where a reference N designates the reciprocal of a divisional-ratio from the Vpp level, namely Vppd/Vpp. Similarly, a relation between the Vpp level and the reference potential Vrh is represented by Vpp=N×Vrh, where a reference N designates the reciprocal of the divisional ratio from the Vpp level Vppd/Vpp.

Figure 7A:
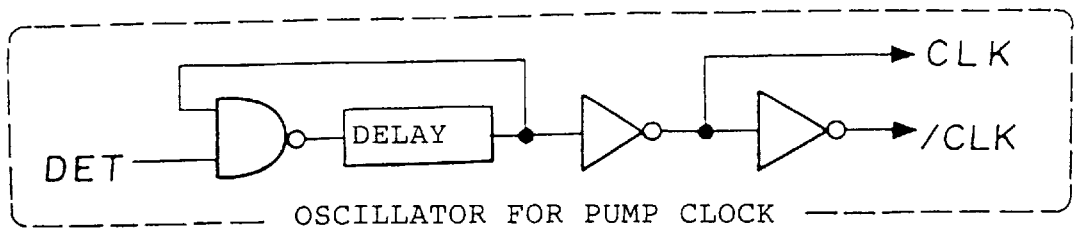
FIG. 7a is a logical circuit diagram of an oscillator for pump clock of a Vpp pump circuit according to Embodiment 1 of the present invention.
Figure 7B:
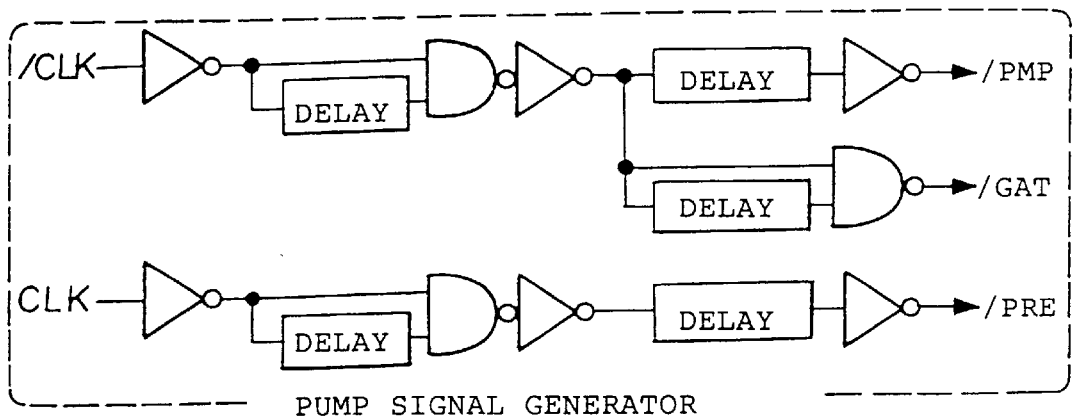
FIG. 7b is a logical circuit diagram of a pump signal generator of the Vpp pump circuit according to Embodiment 1 of the present invention.
Figure 7C:
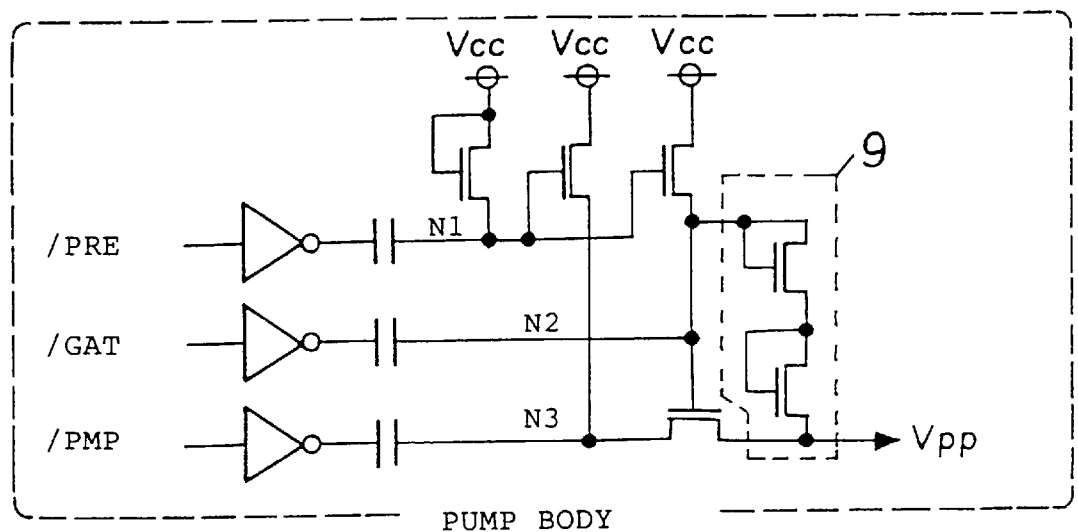
FIG. 7c is a logical circuit diagram of a pump body of the Vpp pump circuit according to Embodiment 1 of the present invention.

Incidentally, an example of the pump circuit is shown in FIG. 7a through 7c.

FIG. 7d explains operation of the pump circuit. In FIG. 7d, references /PRE, /GAT, /PMP, N1, N2, and N3 respectively, show states of points designated by the same references as those in FIG. 7c; and a reference Tc designates a period of clock (CLK); a reference Cp designates pump capacitances; and a numerical reference 9 designates a clamping circuit.

When CLK is low (L) in FIG. 7a, /PRE becomes L in FIG. 7b to thereby precharge nodes N2, N3 with a Vcc level.

When CLK is H in FIG. 7a, /PMP becomes L in FIG. 7b; thereby a node N3 is pushed up to a level of 2×Vcc, thereafter /GAT becomes L to turn on a transistor between Vpp and a node N3 for supplying charges in the pump capacitance Cp to Vpp. Provided that the period of CLK is represented by Tc, a capability Ipp of supplying Vpp by the pump is:

$$Ipp=Cp \times (2Vcc-Vpp)/Tc$$

Figure 23:
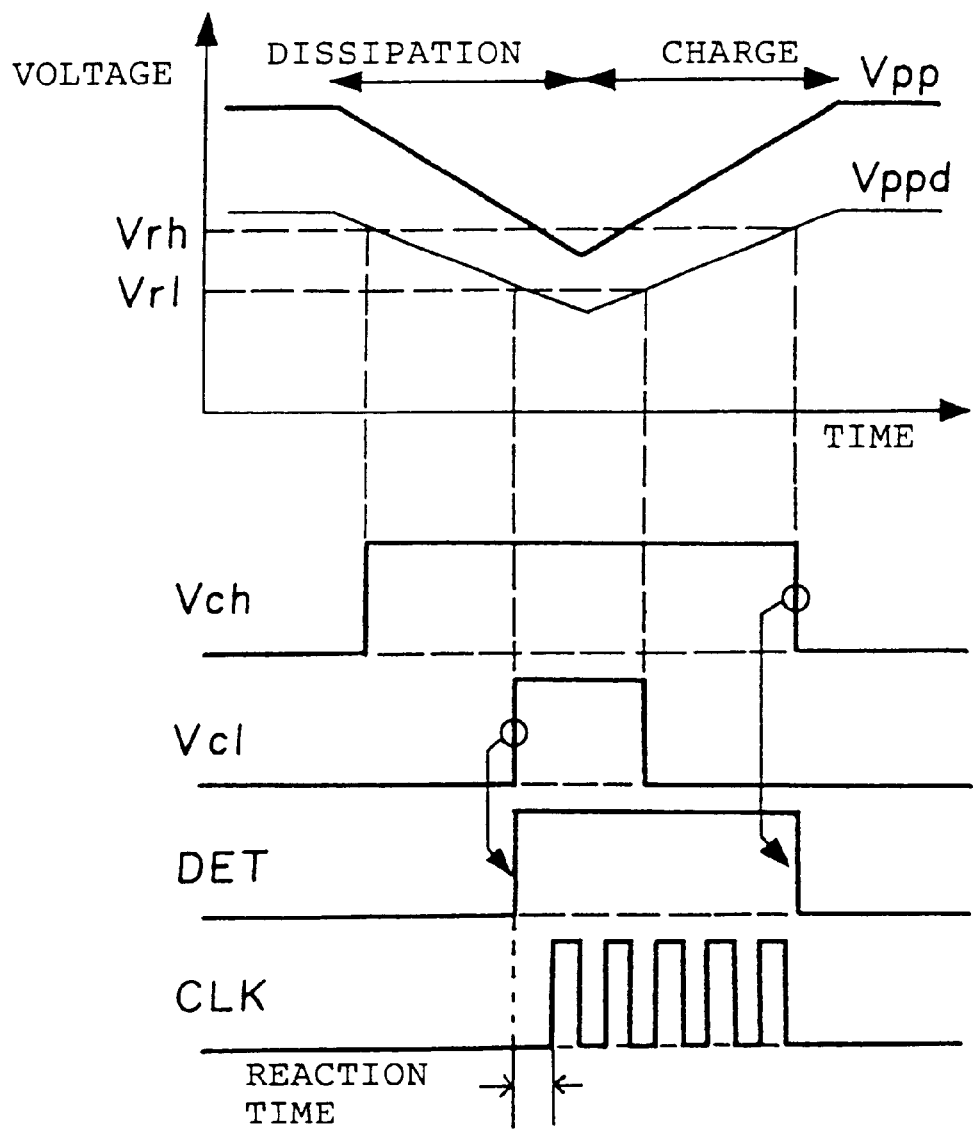
FIG. 23 shows operation of circuits in a usually operating mode along with timing of signals from the circuits.

FIG. 23 shows operation under a usually used mode (i.e. usually used mode) of the system shown in FIG. 1. The Vpp level is lowered as the load on Vpp dissipates Vpp. When the level Vppd obtained by dividing Vpp is lower than the referential potential Vrl, the Vpp level detecting circuit outputs the DET signal H. As a result, the Vpp pump circuit is operated and thereafter the Vpp level is gradually increased, wherein the Vppd level becomes higher than the reference potential Vrh and thereby the Vpp level detecting circuit outputs the DET signal of low (L) to stop the Vpp pump circuit.

Figure 4:
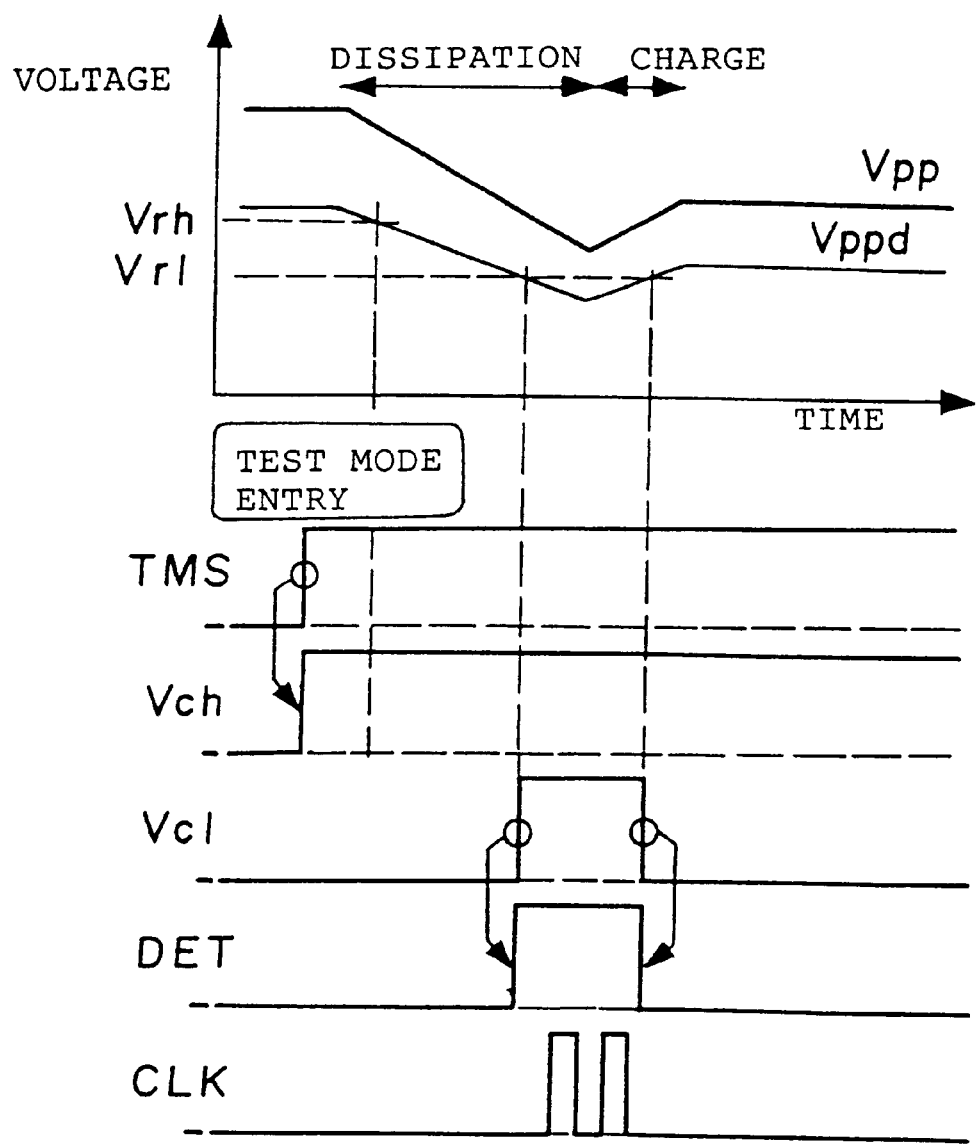
FIG. 4 shows operation of the circuits in a test mode under a state based on the reference potential Vr1 along with timing of signals from the circuits according to Embodiment 1 of the present invention.
Figure 6:
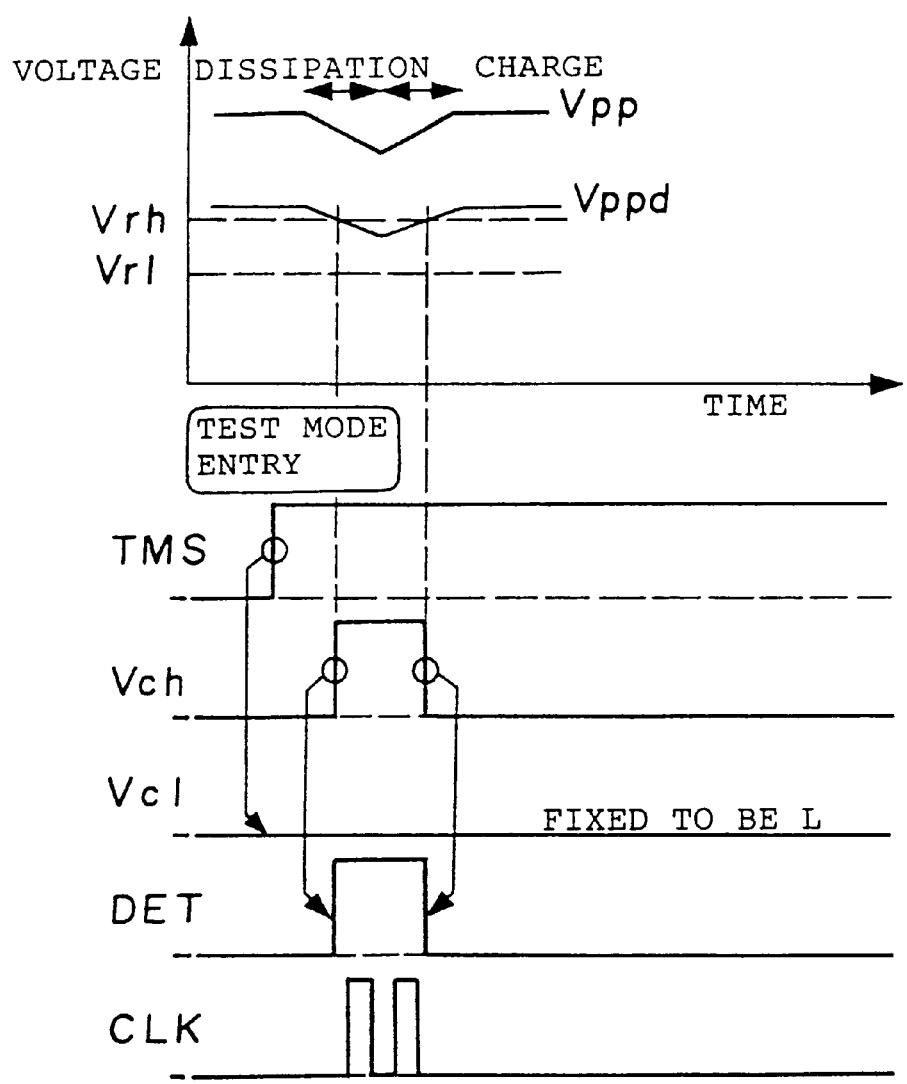
FIG. 6 shows operation of the circuits in a test mode under a state based on the reference potential Vrh along with timing of signals from the circuits according to Embodiment 1 of the present invention.

Operation under a mode of tuning the reference potential values Vc1 and Vch (hereinbelow referred to as a test mode) will be described with reference to FIGS. 4 and 6. In order to enter the test mode, specific combinations of external control signals such as /RAS and addresses are used, for example a /CAS before /RAS entry in an enhanced data output (EDO) DRAM and a test mode resistor set instruction in a synchronous DRAM (SDRAM). Although circuit structures of these are not shown herein, such combinations are generally used.

Provided that the circuit making the entry to the test mode possible is equipped and the test mode entry circuit outputs the signal H when the entry is accomplished by a certain method, one of two comparators included in the Vpp level detecting circuit receiving the signal H, is stopped to operate. For example, when the comparator for comparing the higher reference potential Vrh with the Vppd level is stopped, an output Vch therefrom shown in FIG. 3 is fixed to H. As a result, the Vpp level detecting circuit compares the Vppd level with only the lower reference potential Vrl.

Similarly, when the comparator for comparing the lower reference potential Vrl with the Vppd level is stopped, an output Vc1 shown in FIG. 5 is fixed to H. As a result, the Vpp level detecting circuit compares the Vppd level with only the higher reference potential Vrh.

Accordingly, when the tuning is conducted while monitoring the Vpp level obtained through a monitor pad by means of a tester or the like, it is possible to ideally monitor the Vpp level determined by Vr1 and to further accurately tune one of the levels in the characteristic of hysteresis of the Vpp level detecting circuit.

Although variations in the Vpp level caused by the reaction velocity of the Vpp level detecting circuit and the capability of the Vpp pump circuit are left and a component of such variations may cause a scattering of the tuning level, the accuracy in tuning the characteristic of hysteresis can be greatly improved in comparison with the prior art. As long as Vrh−Vr1=Rc×Ic is stabilized, the characteristic of hysteresis of the Vpp level detecting circuit can be accurately tuned even though the tuning is conducted based on any of the reference potential values.

EMBODIMENT 2

Figure 8:
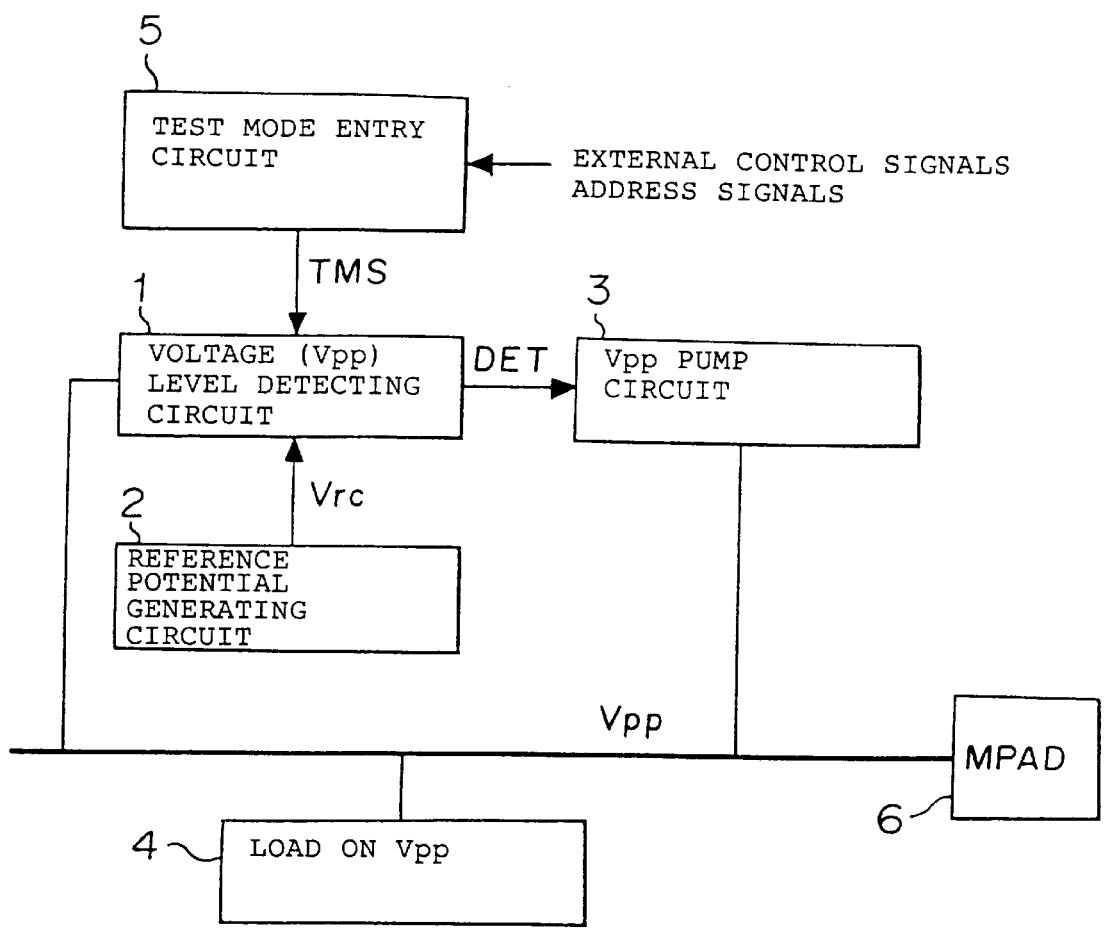
FIG. 8 is a block diagram for showing a relation between circuits and signals according to Embodiment 2 of the present invention.
Figure 10:
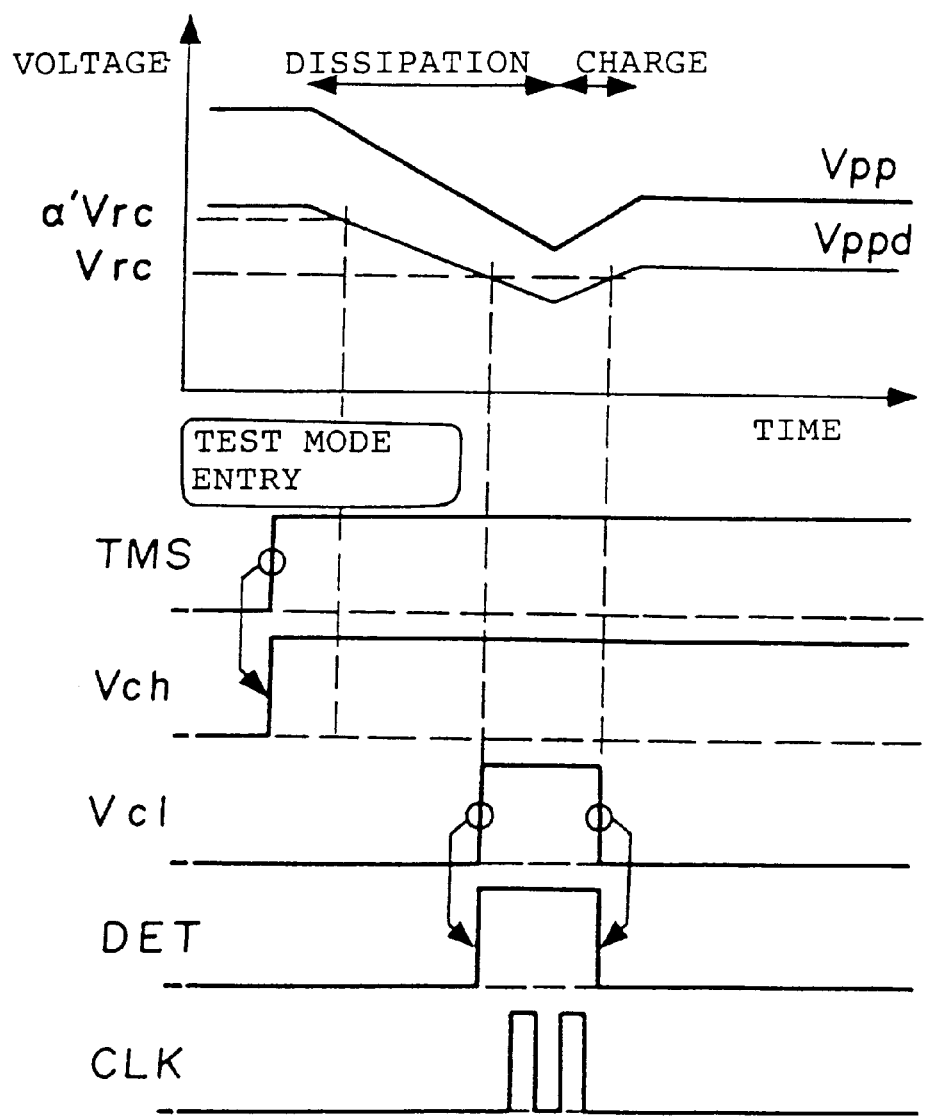
FIG. 10 shows operation of the circuits in a test mode under a state based on the reference potential Vrc along with timing of signals from the circuits according to Embodiment 2 of the present invention.
Figure 11:
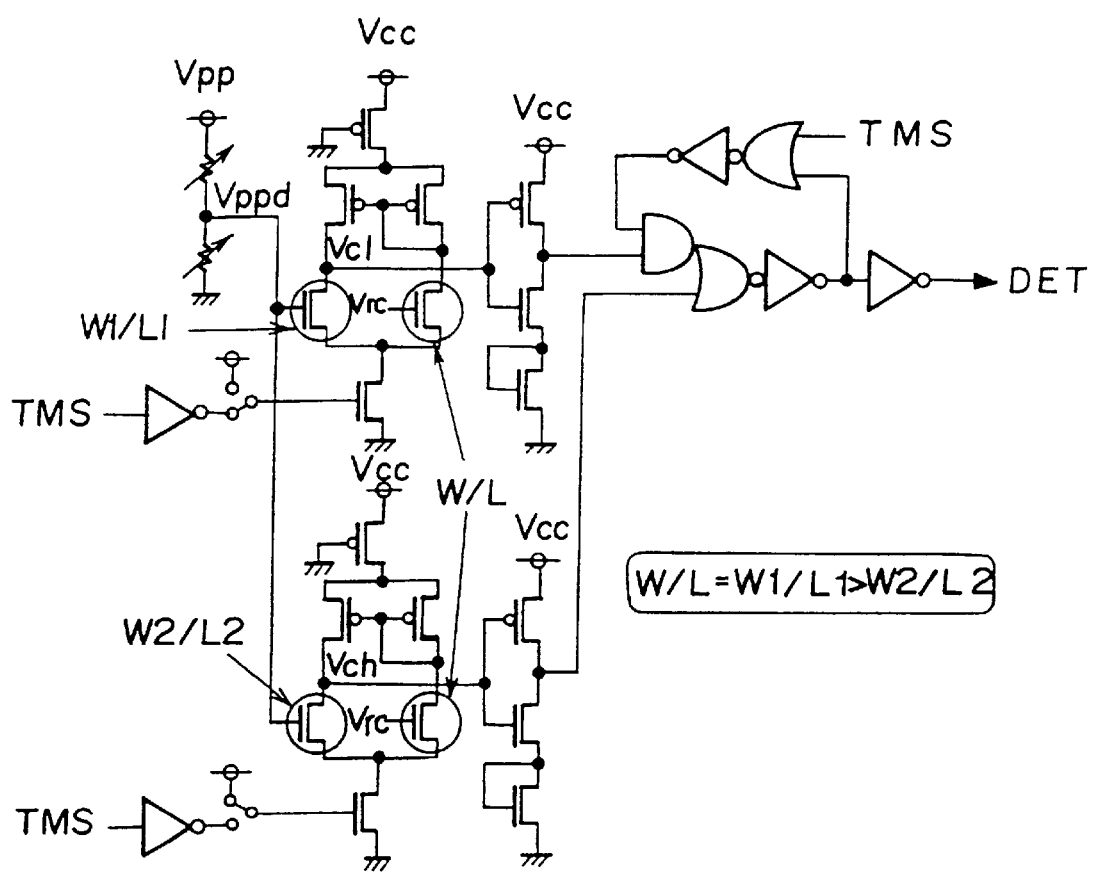
FIG. 11 is a circuit diagram of the circuit for detecting Vpp level in a state based on a reference potential $\alpha*Vrc$ according to Embodiment 2 of the present invention.
Figure 12:
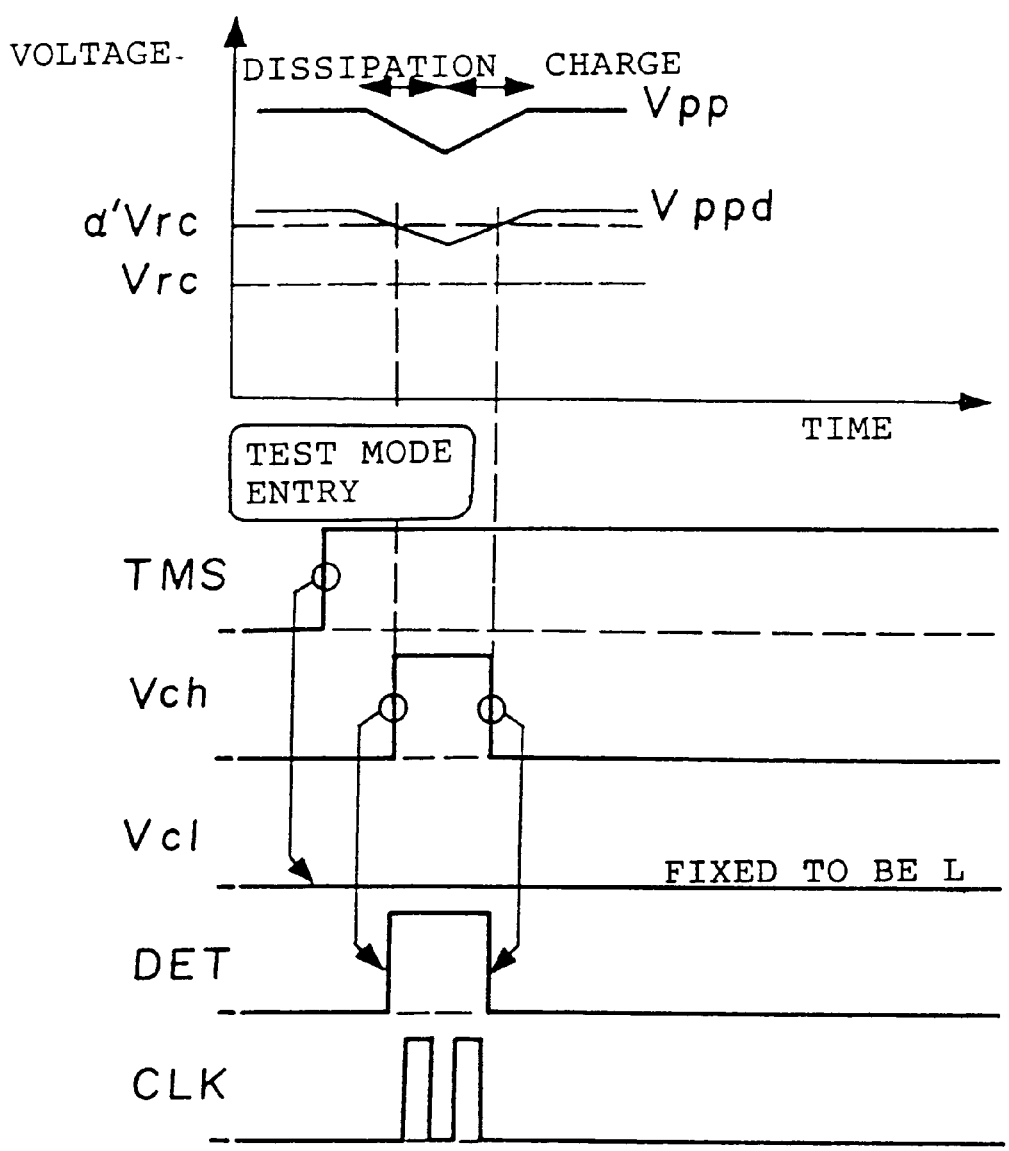
FIG. 12 shows operation of the circuits in a test mode under a state based on the reference potential a *Vrc along with timing of signals from the circuits according to Embodiment 2 of the present invention.

In Embodiment 1, the Vpp level detecting circuit requires the two reference potential values. However, it is also possible to realize a characteristic of hysteresis using one type of reference potential FIG. 8 shows such an example as a whole, wherein a reference Vrc designates a common reference voltage on the lower side in the characteristic of hysteresis FIGS. 9 and 11 show an example of the Vpp level detecting circuit, wherein FIG. 9 shows a state based on the reference potential Vrc and FIG. 11 shows a state based on a modified reference potential α+Vrc, which will be described in the following. Other references are the same as or similar to those described in Embodiment 1.

As for a reference potential generating circuit in FIG. 8, it is possible to use the circuit structure shown in FIG. 2, wherein a difference from that in FIG. 2 resides in that only one of the two reference potential values used in Embodiment 1 is supplied to the Vpp level detecting circuit. In the Vpp level detecting circuit shown in FIGS. 9 and 11, the characteristic of hysteresis is realized by receiving the single reference potential in transistors having different ratios between gate widths (hereinbelow referred to as W) and gate lengths (hereinbelow referred to as L).

The reason why the characteristic of hysteresis is obtainable from the single reference potential Vrc by changing the dimensions W and L of the transistors, both of which transistors receive the same Vppd. In FIGS. 9 and 11, a constant current determined by Vrc flows into the drains of the two transistors having different dimensions respectively. According to the level of Vppd, the level of a potential of the drain is changed. Incidentally, the potential of the drain becomes high as the ratio of W/L is small. On the other hand, the potential of the drain becomes low as Vppd is high. Although the reference potential values Vch and Vcl disclosed in Embodiment 1 are inherently in the level L, when Vppd becomes lower to a certain extent and Vpp is dissipated to further lower Vppd, the potential of drain in the transistor having a smaller W/L ratio becomes in the level of H earlier than that of the transistor having a larger W/L ratio. Thus the characteristic of hysteresis can be realized. In this, provided that the difference between the ratios of W/L is expressed by a coefficient a and the transistor having the smaller W/L ratio directly relates to the reference potential Vrc the transistor having the larger W/L ratio directly relates to the modified reference potential α×Vrc, wherein the coefficient a has a value larger than 1.

EMBODIMENT 3

In Embodiment 1, the relative relation between the two difference potential values for determining the characteristic of hysteresis in the Vpp level detecting circuit is fixed. However, in Embodiment 3, reference potential values can be independently set in order to enhance a degree of freedom.

Figure 13:
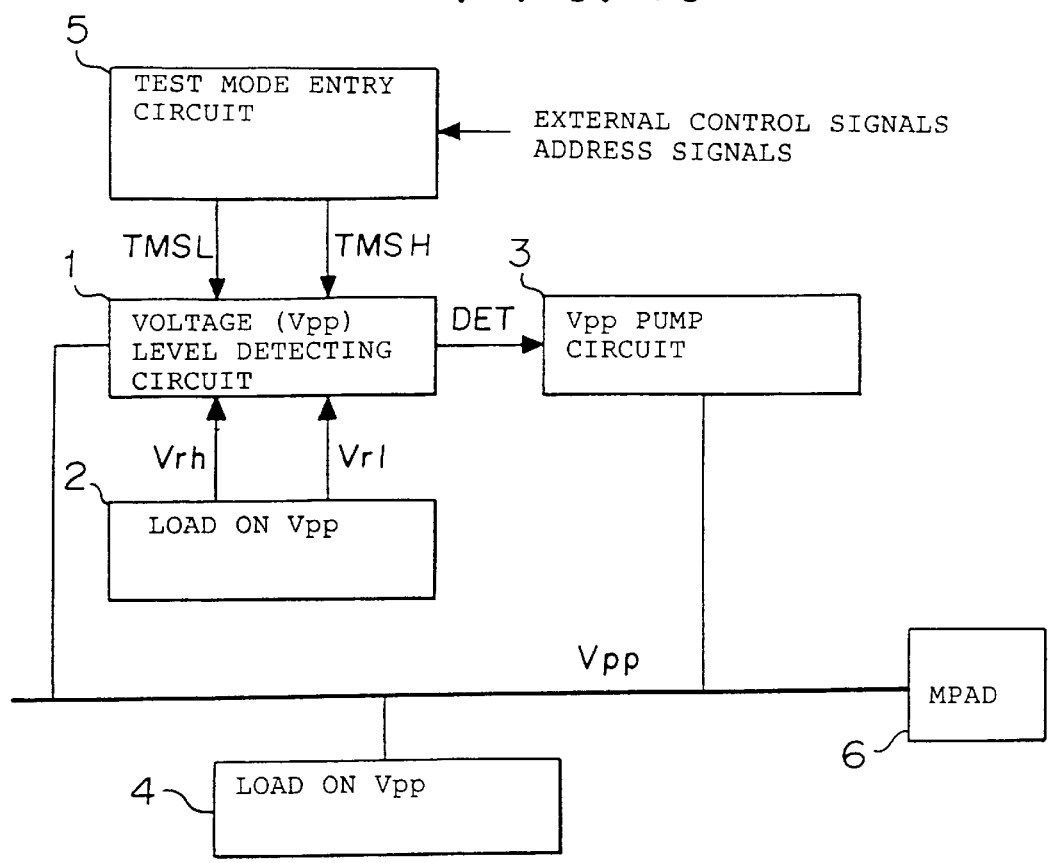
FIG. 13 is a block diagram for showing a relation between circuits and signals according to Embodiment 3 of the present invention.
Figure 14:
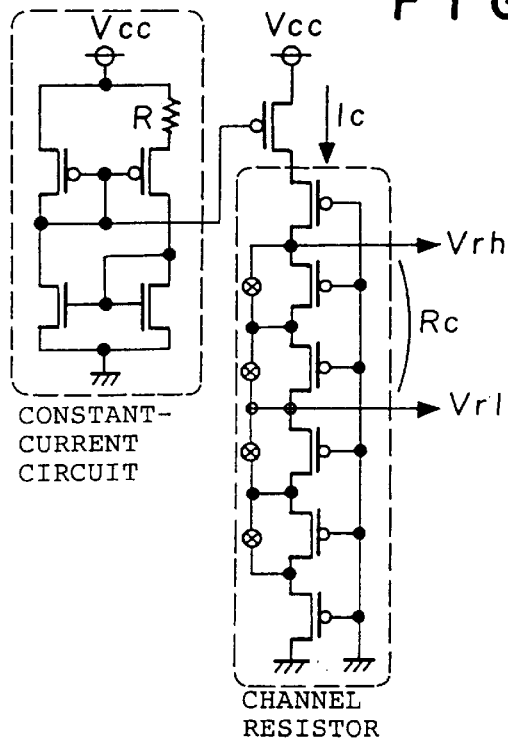
FIG. 14 is a circuit diagram of a circuit for generating reference voltage according to Embodiment 3 of the present invention.

FIG. 13 shows the whole structure in accordance with Embodiment 3. The constitutional elements are the same as those shown in FIG. 1. However, the selection signal (TMS) between the test mode and the usually used mode output from the test mode entry circuit and input into the Vpp level detecting circuit is increased to be two lines, wherein references TMSL and TMSH respectively designate such lines. FIG. 14 shows a reference potential generating circuit according to Embodiment 3. From a viewpoint of reducing a circuit area, the number of row of pMOS resistors is one, and two types of reference potential values are generated by taking out these from different positions. Although such structure is the same as that shown in FIG. 2, in Embodiment 3, fuses are provided between the high reference potential Vrh and the low reference potential Vr1 to enable a value of Rc vary, whereby Vrh can be independently tuned irrespective of Vr1.

Figure 15:
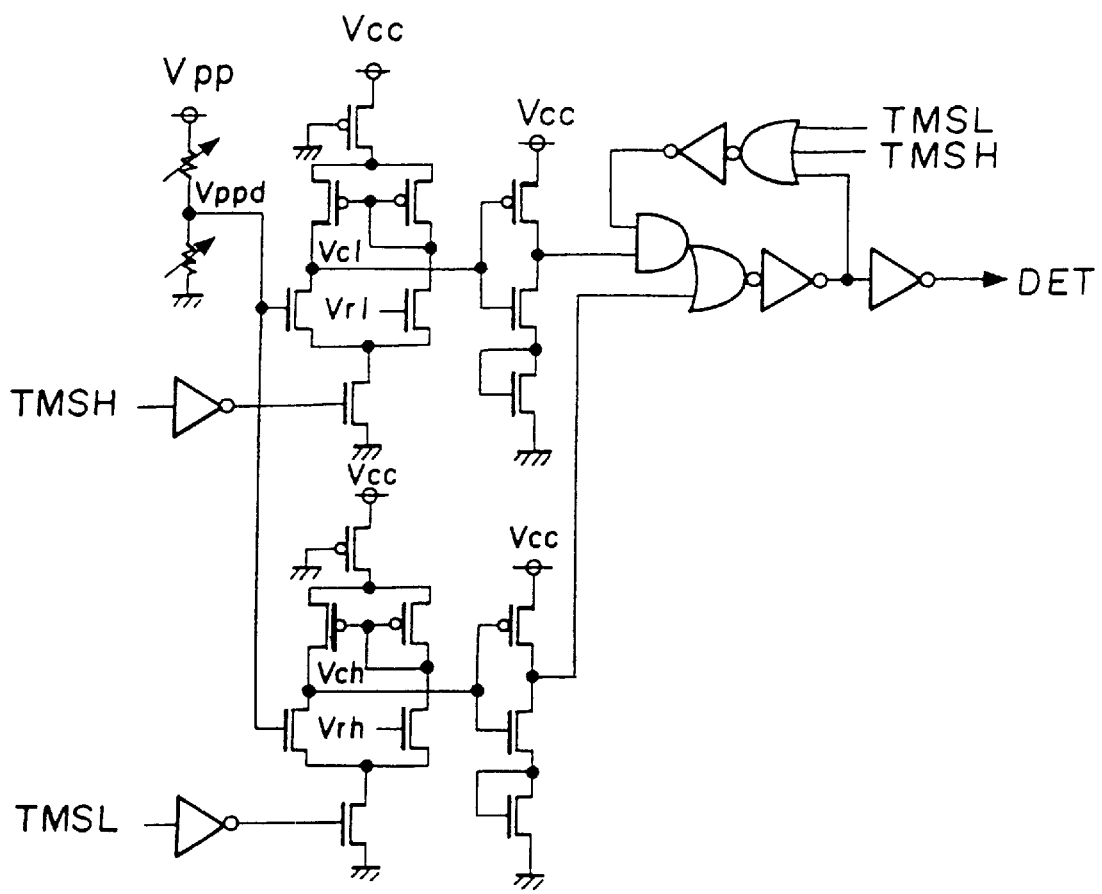
FIG. 15 is a circuit diagram of a circuit for detecting Vpp level in a state based on a reference potential Vr1 according to Embodiment 3 of the present invention.
Figure 16:
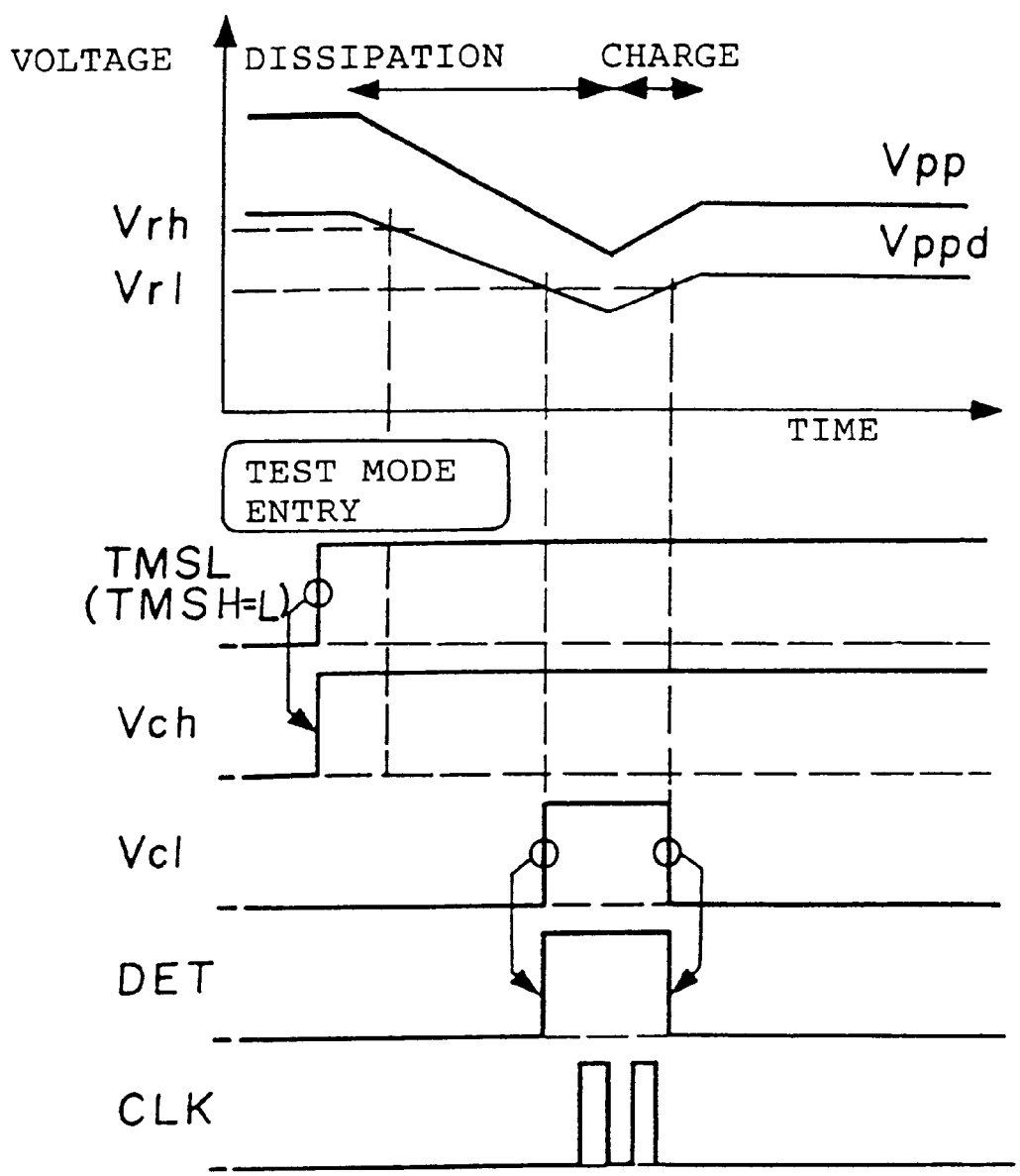
FIG. 16 shows operation of the circuits in a test mode under a state based on the reference potential Vr1 along with timing of signals from the circuits according to Embodiment 3 of the present invention.

FIG. 15 shows a structure of Vpp level detecting circuit under a state that the signal TMSH is fixed to be L. FIG. 16 is a timing chart for explaining the operation of the whole structure according to Embodiment 3 under the state shown in FIG. 15. FIG. 17 shows a structure of Vpp level detecting circuit under a state that the signal TMSL is fixed to be L. FIG. 18 is a timing chart for explaining the operation of the whole structure according to Embodiment 3 under the state shown in FIG. 17.

The Vpp level detecting circuit shown in FIGS. 15 and 17 a differs from FIGS. 3 and 5 mainly in that the comparator based on the reference potential Vrh and the comparator based on the referent potential Vr1 respectively receive the output signals TMSH and TMSL from the test mode entry circuit. These output signals TMSH and TMSL are determined by combinations of external control signals and addresses at the time of test mode entry. For example, the signal TMSH becomes H when the combination of external control signals and addresses means tuning of the high level side of the characteristic of hysteresis in the Vpp level detecting circuit; and the signal TMSL becomes H when the combination means tuning of the low level side of the characteristic of hysteresis in the Vpp level detecting circuit. In other words, it is possible to arbitrarily designate one of the levels of the characteristic of hysteresis in Vpp level detecting circuit.

In the Vpp level detecting circuit, for example, when the signal TMSH=H, the comparator of receiving the low reference potential Vr1 is not operated, whereby the output Vc1 is fixed to H. As a result, the Vpp level is judged in reference of only the high reference potential Vrh, whereby it is possible to accurately determine the high level-side of the characteristic of hysteresis in the Vpp level detecting circuit by adopting the tuning as described in Embodiment 1. On the other hand, when TMSL=H, the comparator of receiving the high reference potential Vrh is not operated, whereby the output Vch is fixed to H. As a result, the Vpp level is determined in reference of only the low reference potential Vr1, whereby it is possible to accurately determine the low level side of the characteristic of hysteresis of the Vpp level detecting circuit. By applying the procedures described in the above, it is possible to accurately tune the characteristic of hysteresis of the Vpp level detecting circuit.

EMBODIMENT 4

In Embodiments 1 and 2, the one of the levels of the characteristic of hysteresis in the Vpp level detecting circuit is determined by directly observing the internal Vpp level from the monitor pad at the time of tuning, wherein the other level is automatically determined. However, when the position of monitor pad is inappropriate and/or there exists an intermediate path of leaking to the other level from the Vpp level, there is a possibility that the characteristic of hysteresis of the Vpp level detecting circuit is not accurately tuned.

Figure 19:
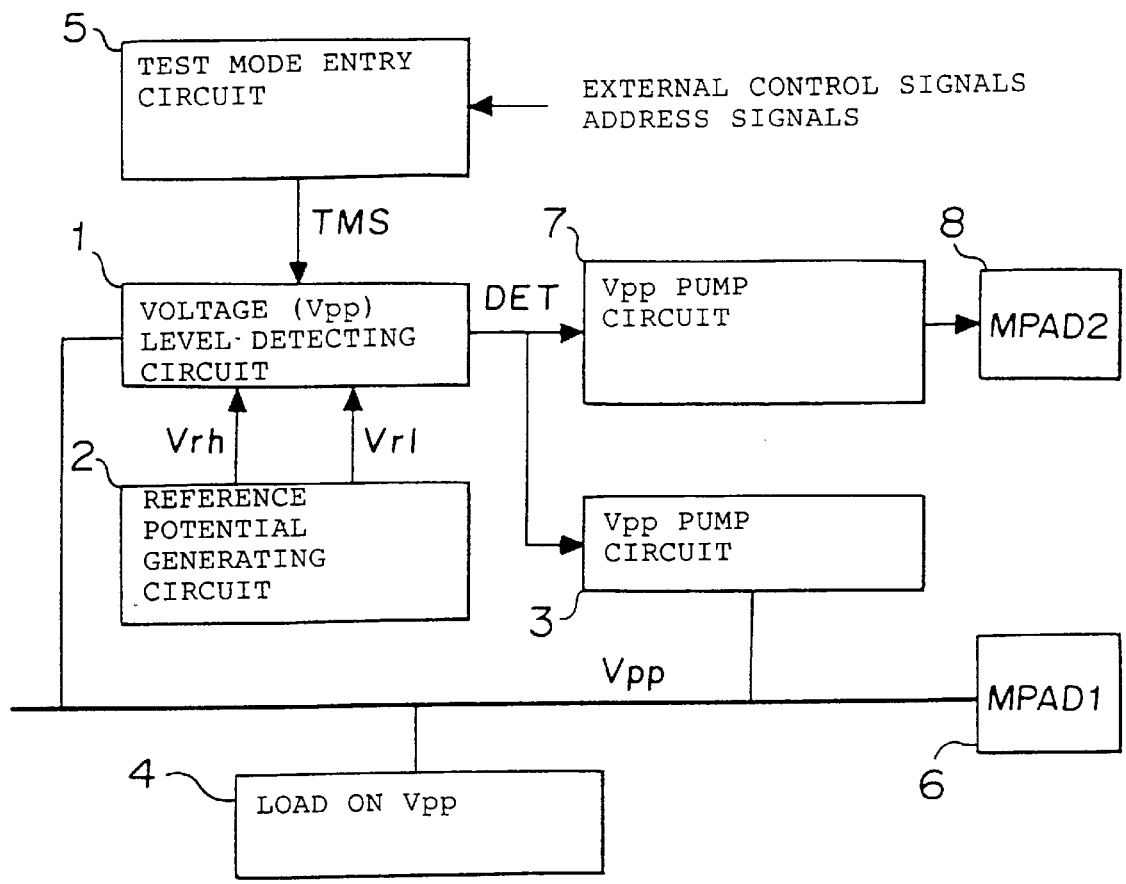
FIG. 19 is a block diagram for showing a relation between circuits and signals according to Embodiment 4 of the present invention.

In Embodiment 4, a structure that an output from a Vpp level detecting circuit can be monitored from the outside. FIG. 19 shows the whole structure according to Embodiment 4. A difference from FIG. 1 is that there are two types of monitor pads and a monitor pad controlling circuit is added. In FIG. 19, a reference numeral 7 designates a monitor pad controlling circuit; a reference MPAD1 is a pad for directly monitoring and forcing a Vpp level; and a reference MPAD2 designates a pad for outputting from the monitor pad controlling circuit.

Figure 20:
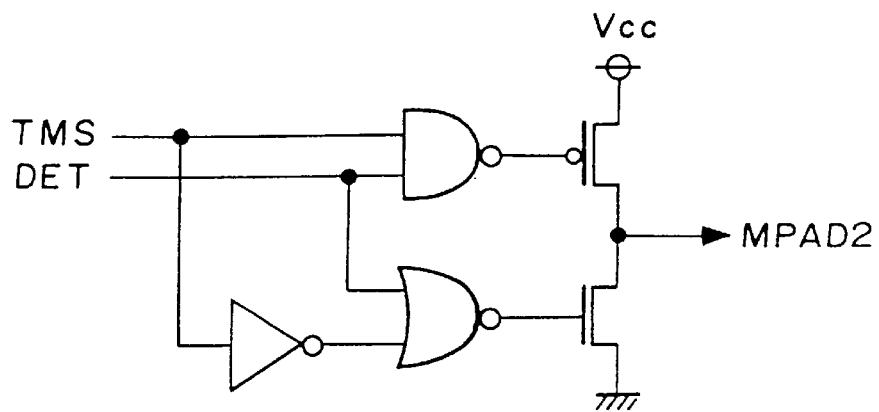
FIG. 20 shows a logical circuit for controlling monitor pad (MPAD)

An example of the structure of the monitor pad controlling circuit is shown in FIG. 20. The output from the monitor pad controlling circuit is in a state of Hi-Z (i.e. floating by a high impedance) under the usually used mode. Under the test mode, it becomes what buffering the output from the Vpp level detecting circuit. Thereafter, it is output from the monitor pad MPAD2 to the outside. Therefore, the pure characteristic of hysteresis in the Vpp level detecting circuit can be observed, whereby it is possible to perform completely accurate tuning.

Figure 21:
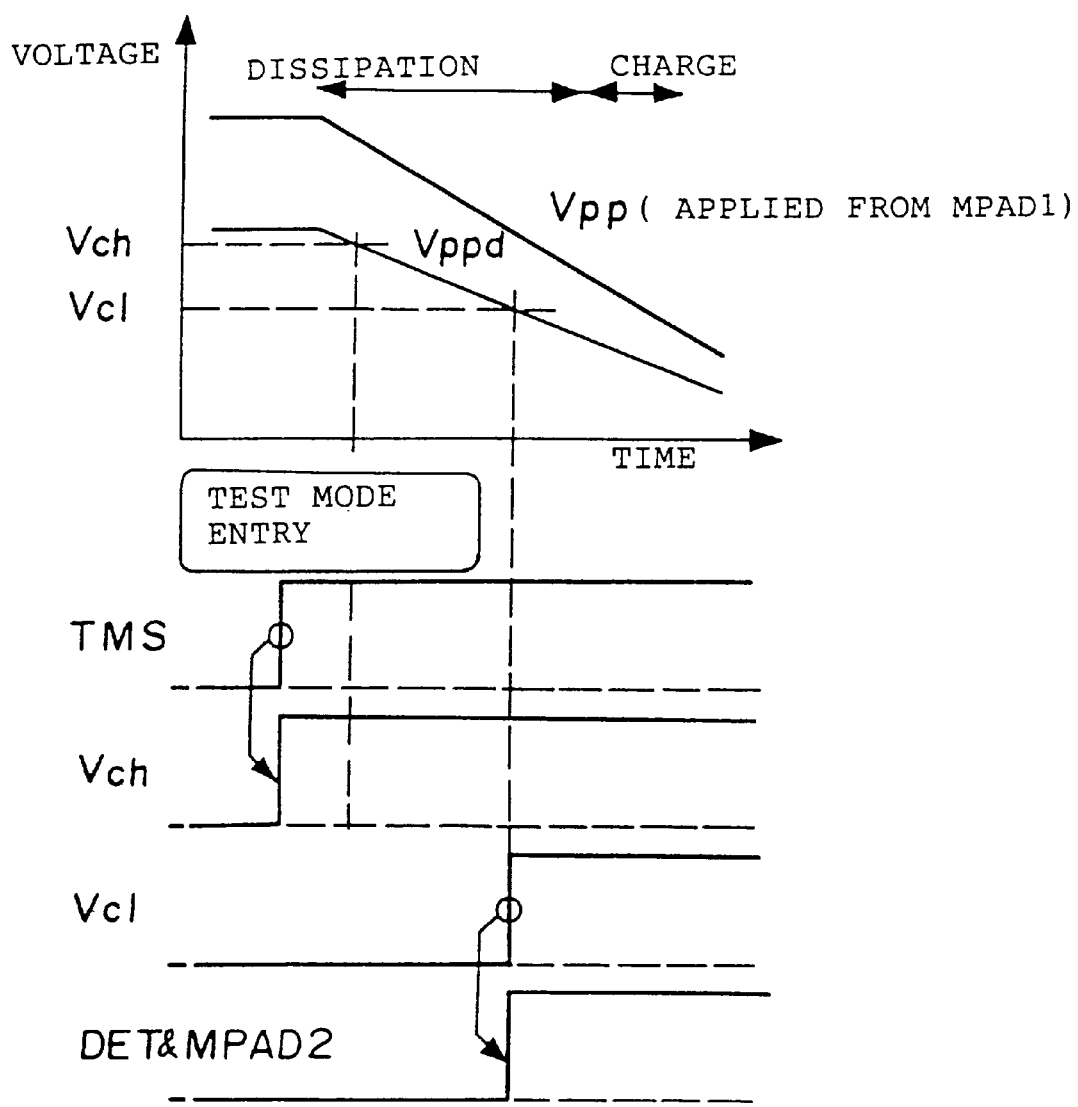
FIG. 21 shows operation of circuits in a test mode along with timing of signals from the circuits according to Embodiment 4 of the present invention.

In the structure shown in FIG. 19, the procedures of tuning described in Embodiment 1 and so on are changed. Such change is explained in FIG. 21. After the test mode entry, the Vpp level is supplied from the outside to the inside of chip through the pad MPAD1 when the tuning is performed. In accordance therewith, the Vpp level detecting circuit is reacted and the output of the valid one of the levels in the characteristic of hysteresis can be changed. In FIG. 21, a case that only the low reference potential is valid is shown. Based on the above information, fuses in the reference potential generating circuit shown in FIG. 2 or FIG. 14 are trimmed.

EMBODIMENT 5

Figure 22:
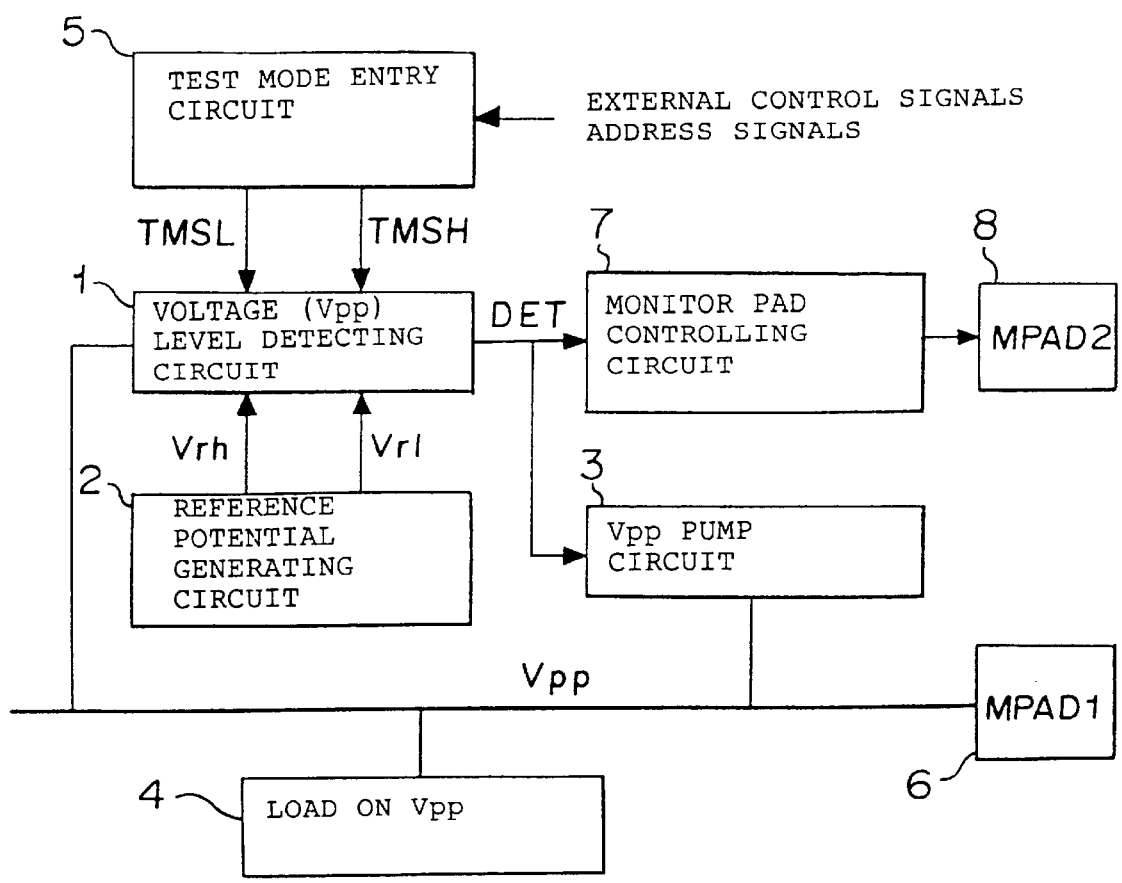
FIG. 22 is a block diagram for showing a relation between circuits and signals according to Embodiment 5 of the present invention.

FIG. 22 is an example of circuit structure for performing the tuning like that described in Embodiment 4 and also corresponding to Embodiment 3. In Embodiment 5, a monitor pad controlling circuit and a pad MPAD2 are additionally provided in the structure described in Embodiment 3, and further a pad MPAD1 are substitutionally provided instead of the pad MPAD. In accordance with Embodiment 5, it is possible that both of the levels in the characteristics of hysteresis of the Vpp level detecting circuit can be determined in a completely accurate manner.

The structure according to Embodiment 5 is similar to that of Embodiment 4 except that the signal for activating the monitor pad controlling circuit is an OR signal of TMSH/ TMSL. The procedures of practical tuning are the same as that described in Embodiment 4.

The first advantage of the circuit according to the present invention is that accuracy for tuning a characteristic of hysteresis can be greatly improved because each of reference potential values forming hysteresis can be respectively tuned.

The second advantage of a circuit according to the present invention is that only one reference potential generated by a reference potential generating circuit can be expanded to a pair of reference potential values forming hysteresis using a pair of transistors having different gate widths and different gate lengths.

According to the third advantage of a circuit according to the present invention is that a characteristic of hysteresis of a Voltage level detecting circuit can be accurately tuned because each of reference potential values forming the hysteresis can respectively be tuned.

The fourth advantage of a circuit according to the present invention is that completely accurate tuning of reference potential values forming hysteresis can be performed by monitoring an output from a voltage level detecting circuit directly.

The fifth advantage of a circuit according to the present invention is that completely accurate tuning can be performed by monitoring an output from a voltage level detecting circuit directly and by adjusting each of the reference potential values respectively.

Obviously, numerous modifications and variations of the present invention are possible in light of the above teachings. It is therefore to be understood that within the scope of the appended claims, the invention may be practiced otherwise than as specifically described herein.

What is claimed is:

1. A voltage level detecting circuit for receiving an input voltage and generating a detection signal in a hysteresis manner to adjust a potential value of said voltage by comparing said potential value with a plurality of reference potential values from a reference potential generating circuit in a first operation mode, and generating said detection signal in a non-hysteresis manner to adjust said potential value of said input voltage by selecting one of said plurality of reference potential values in response to a second mode signal externally applied thereto and comparing said input voltage with said selected reference potential value in a second operation mode.

2. The voltage level detecting circuit according to claim 1, comprising:

a plurality of comparators corresponding to and receiving said plurality of reference potential values respectively, for comparing said plurality of reference potential values with said input voltage so as to generate said detection signal in said first operation mode, wherein in said second operation mode, one of said plurality of comparators is activated to compare said input voltage with a selected reference potential value corresponding to said one of the comparators.

3. The voltage level detecting circuit according to claim 2, further comprising:

a plurality of terminals for receiving said second mode signal instructing said voltage level detecting circuit to enter said second operation mode, and a plurality of switches respectively connected between said terminals and said comparators to connect and disconnect transmission of said second mode signal to said comparator, wherein said second operation mode is selected upon receipt of said second mode signal, and in said second operation mode, said one of the comparators to be activated is selected by turning on or turning off one of said switches corresponding to said one of the comparators.

4. A voltage level adjusting circuit activated based on a plurality of reference potential values forming hysteresis under a usually operating condition and using one of said plurality of reference potential values to determine a voltage in a load connected thereto under a testing condition, which comprises:

a voltage level detecting circuit;

a reference potential generating circuit for outputting signals of said plurality of reference potential values to said voltage level detecting circuit; and a voltage pump circuit receiving a detection signal outputted from said voltage level detecting circuit, an output of said voltage pump circuit being coupled to said load and said voltage level detecting circuit through a line, wherein under the testing condition, one of said signals of the plurality of reference potential values is selected in said voltage level detecting circuit for adjusting a potential value of said voltage in the load by setting said reference potential generating circuit so that said load is supplied with said voltage within a range permissible for operation of the load from said voltage pump circuit.

5. The voltage level adjusting circuit according to claim 4, further comprising:

a test mode entry circuit for outputting a test mode signal to said voltage level detecting circuit for entering the voltage level adjusting circuit in the testing condition; and a monitor pad connected to said line for accessing said voltage in said load.

6. The voltage level adjusting circuit according to claim 5, wherein said voltage level detecting circuit includes a plurality of comparators respectfully corresponding to and receiving said plurality of reference potential values for comparing these with said voltage to output said detection signal for determining timing for starting and ceasing a supply of said voltage to said voltage pump circuit under the usually operating condition, and under the testing condition, one of said plurality of comparators is activated to compare said voltage with said one of the reference potential values corresponding to said one of the comparators.

7. The voltage level adjusting circuit according to claim 4, wherein said voltage level detecting circuit includes a plurality of comparators respectively corresponding to and receiving said plurality of reference potential values for comparing these with said voltage to output said detection signal for determining timing for starting and ceasing a supply of said voltage to said voltage pump circuit under the usually operating condition, and under the testing condition, one of said plurality of comparators is activated to compare said voltage with said one of the reference potential values corresponding to said one of the comparators.

8. The voltage level adjusting circuit according to claim 9, further comprising:

a test mode entry circuit for outputting a test mode signal to said voltage level detecting circuit for entering the voltage level adjusting circuit in the testing condition; and a monitor pad connected to said line for accessing said voltage in said load, wherein, in said plurality of comparators in said voltage level detecting circuit, transistors having different gate widths, different gate lengths, or both of the different gate widths and the different gate lengths are included to generate said reference potential values based on said single signal received from said reference potential generating circuit.

9. A voltage level adjusting circuit activated based on reference potential values forming hysteresis under a usually operating condition and using one of the reference potential values to determine a voltage in a load connected thereto under a testing condition, which comprises:

a voltage level detecting circuit;

a reference potential generating circuit for outputting a single signal to said voltage level detecting circuit; and a voltage pump circuit receiving a detection signal outputted from said voltage level detecting circuit and output of said voltage pump circuit being coupled to said load and said voltage level detecting circuit through a line, wherein under the testing condition, one of the reference potential values is selected in said voltage level detecting circuit for adjusting a potential value of said voltage in the load, said voltage level detecting circuit includes a plurality of comparators respectively corresponding to said reference potential values receiving the single signal in common for comparing the reference potential values with said voltage to output said detection signal for determining timing for starting and ceasing a supply of said voltage to said voltage pump circuit under the usually operating condition, and under the testing condition one of said plurality of comparators is activated to compare said voltage with said one of the reference potential values.

10. The voltage level adjusting circuit according to claim 4, further comprising:

a test mode entry circuit for outputting a plurality of test mode signals for entering the voltage level adjusting circuit in the testing condition; and a monitor pad connected to said line for accessing said voltage in said load, wherein said voltage level detecting circuit includes a plurality of comparators respectively corresponding to and receiving said plurality of reference potential values for comparing these with said voltage to output said detection signal for determining timing for starting and ceasing a supply of said voltage to said voltage pump circuit under the usually operating condition, said plurality of comparators receive said plurality of test mode signals and output said detection signal based on states of said plurality of test mode signals, and under the testing condition, one of said plurality of comparators is activated to compare said voltage with said one of the reference potential values corresponding to said one of the comparators.

11. The voltage level adjusting circuit according to claim 5, further comprising:

a monitor pad controlling circuit which receives said detection signal from said voltage level detecting circuit and buffers the detection signal, and a second monitor pad for drawing out the output of the buffered detection signal from said monitor pad controlling circuit for directly observing the detection signal.

12. The voltage level adjusting circuit according to claim 4, further comprising:

a monitor pad controlling circuit which receives said detection signal from said voltage level detecting circuit and buffers the detection signal, and a monitor pad for drawing out the output of the buffered detection signal from said monitor pad controlling circuit for directly observing the detection signal.

13. The voltage level adjusting circuit according to claim 10, further comprising:

a monitor pad controlling circuit which receives said detection signal from said detection signal from said voltage level detecting circuit and buffers the detection signal, and a monitor pad for drawing out the output of the buffered detection signal from said monitor pad controlling circuit for directly observing the detection signal.

14. A circuit for adjusting a level of a voltage used in an electrical load comprising:
    a voltage level detecting circuit,
    a reference potential generating circuit for outputting signals of a pair of reference potential values to said voltage level detecting circuit,
    a voltage pump circuit receiving a detection signal outputted from said voltage level detecting circuit, an output of said voltage pump circuit being coupled to said voltage level detecting circuit through a line,
    a load connected to said line and dissipating said voltage,
    a test mode entry circuit for outputting a test mode signal to said voltage level detecting circuit, and
    a monitor pad connected to said line for accessing said voltage in said line, wherein
        said reference potential generating circuit includes fuses for adjusting said signals of the pair of reference potential values;
        said voltage level detecting circuit includes:
            an input terminal for receiving said voltage in said line,
            a voltage dividing circuit for outputting a voltage signal to be compared with said signals of the pair of reference potential values,
            terminals for receiving said test mode signal,
            comparators respectively provided to receive said signals of the pair of reference potential values, said voltage signal, and said test mode signal, for comparing said voltage signal with one of said signals of the pair of reference potential values according to a state of said test mode signal in order to output said detection signal for stating timing for starting the supply and timing for ceasing the supply,
            switches respectively provided for said comparators to connect and to disconnect transmission of said test mode signal to said comparators, and
            a circuit for outputting said detection signal based on the state of said test mode signal;
        said test mode entry circuit outputs said test mode signal upon receipt of combinations of external control signals and address signals; and
        one of said signals of the pair of reference potential values is selected for adjusting the same in the voltage level detecting circuit by trimming the fuses in said reference potential generating circuit while monitoring said voltage of said line from said monitor pad so that said load is supplied with said voltage within a range permissible for operation of the load from said voltage pump circuit.

15. A circuit for adjusting a level of a voltage used in an electrical load comprising:
    a voltage level detecting circuit;
    a reference potential generating circuit for outputting a single signal to produce reference potential values in said voltage level detecting circuit;
    a voltage pump circuit receiving a detection signal outputted from said voltage level detecting circuit, an output of said voltage pump circuit being coupled to said voltage level detecting circuit through a line;
    a load connected to said line and dissipating said voltage;
    a test mode entry circuit for outputting a test mode signal to said voltage level detecting circuit; and
    a monitor pad connected to said line for accessing said voltage in said line wherein said reference potential generating circuit includes fuses for adjusting said single signal,
    said voltage level detecting circuit including:
        an input terminal for receiving said voltage in said line;
        a voltage dividing circuit for outputting a voltage signal;
        terminals for receiving said test mode signal;
        comparators provided to receive said single signal said voltage signal and said test mode signal for comparing said voltage signal with one of the reference potential values according to a state of said test mode signal in order to output said detection signal for stating timing for starting the supply and timing for ceasing the supply;
        switches respectively provided for said comparators to connect and to disconnect transmission of said test mode signal to said comparators; and
        a circuit for outputting said detection signal based on the state of said test mode signal,
    wherein said test mode entry circuit outputs said test mode signal upon receipt of combinations of external control signals and address signals,
    one of said reference potential values is selected for adjusting the same in the voltage level detecting circuit by trimming the fuses in said reference potential generating circuit while monitoring said voltage of said line from said monitor pad so that said load is supplied with said voltage within a range permissible for operation of the load from said voltage pump circuit, and
    in said comparators in said voltage level detecting circuit, transistors having different gate widths, different gate lengths, or both of the different gate widths and the different gate lengths are provided to generate said reference potential values based on said single signal received from said reference potential generating circuit.

16. The circuit for adjusting a level of a voltage used in an electrical load according to claim 14, wherein
    said reference potential generating circuit includes:
        a constant-current circuit for generating a constant current and a channel resistor receiving the constant current, wherein said channel resistor includes transistors connected in serial so that the drain of one of the transistors is connected to the source of the other transistor adjacent thereto, the gates of the transistors are commonly connected, and said signals of the pair of reference potential values are respectively output from different connections between he drains and the sources; and said fuses are respectively provided between the sources and the drains of the transistors so that said signals of the pair of reference potential values can be independently determined by partially trimming said fuses;
    said test mode entry circuit outputs the test mode signal including first and second signals respectively for stating a test based on said one of said signals of the pair of reference potential values and a test based on the other signal of the pair of reference potential values; and
    in said voltage level detecting circuit, the comparators receive said first and second signals; the switches are respectively provided to connect and disconnect transmission of the first and second signals to the respective comparators; and the circuit for outputting said detection signal outputs the detection signal based on states of said first and second signals.

17. The circuit for adjusting a level of a voltage used in an electric load according to claim 16, further comprising:
   a monitor pad controlling circuit which receives said detection signal from said voltage level detecting circuit and buffers the detection signal, and
   a second monitor pad for drawing out the output of the buffered detection signal from said monitor pad controlling circuit for directly observing the detection signal.

18. The circuit for adjusting a level of a voltage used in an electric load according to claim 14, further comprising:
   a monitor pad controlling circuit which receives said detection signal from said voltage level detecting circuit and buffers the detection signal, and
   a second monitor pad for drawing out the output of the buffered detection signal from said monitor pad controlling circuit for directly observing the detection signal.

* * * * *